United States Patent
Suwa et al.

(10) Patent No.: US 6,933,087 B2
(45) Date of Patent: *Aug. 23, 2005

(54) PRECURSOR COMPOSITION FOR POSITIVE PHOTOSENSITIVE RESIN AND DISPLAY MADE WITH THE SAME

(75) Inventors: Mitsuhito Suwa, Shiga (JP); Kazuto Miyoshi, Shiga (JP); Masao Tomikawa, Shiga (JP)

(73) Assignee: Toray Industries, Inc., Tokyo (JP)

( * ) Notice: Subject to any disclaimer, the term of this patent is extended or adjusted under 35 U.S.C. 154(b) by 164 days.

This patent is subject to a terminal disclaimer.

(21) Appl. No.: 10/258,660

(22) PCT Filed: Feb. 21, 2002

(86) PCT No.: PCT/JP02/01517

§ 371 (c)(1), (2), (4) Date: Mar. 3, 2003

(87) PCT Pub. No.: WO02/069041

PCT Pub. Date: Sep. 6, 2002

(65) Prior Publication Data

US 2003/0194631 A1 Oct. 16, 2003

(30) Foreign Application Priority Data

Feb. 26, 2001 (JP) ........................................ 2001-049951

(51) Int. Cl.⁷ .............................. G03F 7/023; G03F 7/30
(52) U.S. Cl. ............................. 430/7; 430/18; 430/191; 430/192; 430/193; 430/326; 430/330; 430/906
(58) Field of Search ........................... 430/7, 191, 192, 430/193, 326, 330, 906, 18, 28

(56) References Cited

U.S. PATENT DOCUMENTS 5,753,407 A * 5/1998 Oba ........................... 430/191

6,593,043 B2 * 7/2003 Suwa et al. .................... 430/18
2004/0023147 A1 * 2/2004 Hirano et al. ............... 430/191

* cited by examiner

Primary Examiner—John S. Chu
(74) Attorney, Agent, or Firm—Morrison & Foerster LLP

(57) ABSTRACT

A positive photosensitive resin precursor composition which can be can be developed in an alkaline developer is provided. The positive photosensitive resin precursor composition comprises (a), one of (b1) and (b2), and (c):

(a) a polyamic acid ester and/or a polyamic acid polymer, both of which are soluble in an alkaline aqueous solution;

(b1) a phenolic-hydroxyl-group-containing thermally crosslinkable compound comprising an organic-group-$R^1$-substituted methylol group represented by formula (1) (wherein $R^1$ is not a hydrogen atom), $$\text{---}(CH_2\text{---}OR^1) \qquad (1);$$

(b2) a thermally crosslinkable compound containing a ureal organic group substituted by an organic group $R^1$ and represented by formula (2)

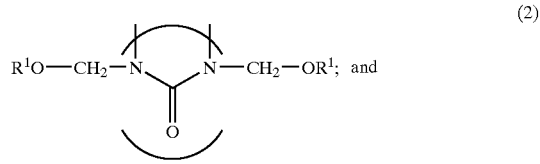

(c) an esterified quinone diazide compound.

13 Claims, No Drawings

PRECURSOR COMPOSITION FOR POSITIVE PHOTOSENSITIVE RESIN AND DISPLAY MADE WITH THE SAME

TECHNICAL FIELD

The present invention relates to a positive photosensitive resin precursor composition, the UV-exposed portion of which dissolves in an alkaline aqueous solution, suitable for use in surface protection films and interlayer insulating films of semiconductor elements and insulating layers for organic electroluminescent elements. The present invention also relates to a display device using the precursor composition.

BACKGROUND ART

Regarding the positive heat-resistant resin precursor compositions, the exposed portion of which dissolves in an alkaline developer, those prepared by adding a naphthoquinone diazide to a polyamic acid (Japanese Unexamined Patent Application Publication No. 52-13315, U.S. Pat. No. 4,093,461), those prepared by adding naphthoquinone diazide to a soluble polyimide having a hydroxyl group (Japanese Unexamined Patent Application Publication No. 64-60630, European Patent No. 264678A1), and those prepared by adding a naphthoquinone diazide to polyamide having hydroxyl groups and (Japanese Unexamined Patent Application Publication No. 56-27140, European Patent No. 23662A1) are known in the art.

In a composition containing a common polyamic acid and naphthoquinone diazide, the effect of naphthoquinone diazide that decreases the solubility in an alkaline solution is weak compared to the solubility of the carboxyl groups in the polyamic acid. Thus, a desired pattern cannot be obtained in most cases, which is a problem. In order to control the alkali solubility of the polyamic acid, a polyamic acid derivative in which a carboxyl group of the polyamic acid is protected by an ester group has been developed. However, in a composition containing this polyamic acid derivative and naphthoquinone diazide, the effect of the naphthoquinone diazide to decrease the solubility in an alkaline solution becomes excessively strong. As a result, although desired patterns can be obtained, a dramatic decrease in the sensitivity occurs, which is a problem.

To overcome this problem, the addition of compounds having various phenolic hydroxyl groups to the composition containing the polyamic acid derivative and naphthoquinone diazide has been proposed. Such an addition easily increases the sensitivity; however, the compound fly off during the curing process for forming a polyimide film, thereby increasing the shrinkage rate after curing. The two characteristics have been difficult to achieve simultaneously.

DISCLOSURE OF THE INVENTION

The present invention is a positive photosensitive resin precursor composition characterized by comprising (a), one of (b1) and (b2), and (c) described below:
(a) polyamic acid ester and/or polyamic acid polymer, both of which are soluble in an alkaline aqueous solution;
(b1) a phenolic-hydroxyl-group-containing thermally crosslinkable compound comprising a methylol group substituted by an organic group $R^1$ represented by formula (1) (wherein $R^1$ is not a hydrogen atom), $$\text{-(CH}_2\text{-OR}^1\text{)} \qquad (1);$$

(b2) a thermally crosslinkable compound comprising a urea system organic group substituted by an organic group $R^1$ represented by formula (2)

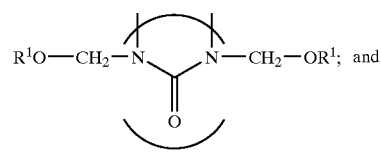

(c) an esterified quinone diazide compound.

BEST MODE FOR CARRYING OUT THE INVENTION

In order to achieve an increase sensitivity and inhibiting thermal shrinking after curing, the present invention is characterized by adding a thermally crosslinkable compound comprising a specific organic group to a polyimide precursor and a naphthoquinone diazide compound. The resin composition obtained by the present invention hardly dissolves in an alkaline developing solution before exposure, but readily dissolves in the alkaline developing solution after exposure. Thus, films rarely shrink during the development, exposure can be completed in a short time, and the shrinkage rate after curing can be reduced since crosslinks are formed due to the thermally crosslinkable compound used in the present invention.

The polyamic acid ester and/or polyamic acid polymer (a), both of which are soluble in an alkaline aqueous solution, can form a polymer having a cyclic structure such as a imide ring or an oxazole ring by heating or with an adequate catalyst. The cyclic structure drastically increases the heat resistance and the solvent resistance.

The polymer (a) of the present invention has a main component comprising a structural unit or structural units represented by formula (3) and/or formulas (8) to (11) below:

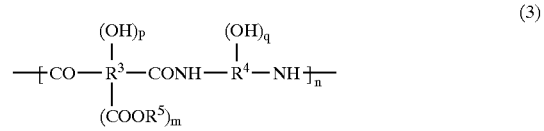

(wherein $R^3$ is a bivalent to octavalent organic group comprising at least two carbon atoms, $R^4$ is a bivalent to hexavalent organic group containing at least two carbon atoms, $R^5$ is hydrogen or an organic group having a carbon number of 1 to 20, n is an integer between 10 and 100000, m is an integer between 0 and 2, p and q are each an integer between 0 and 4, and p+q>0); and

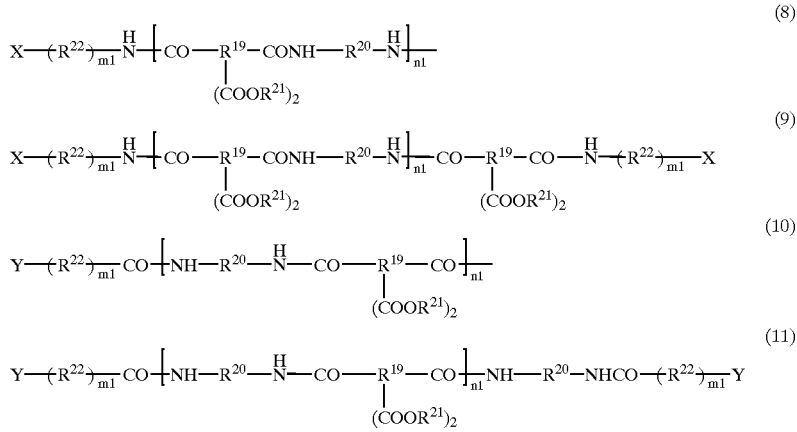

(wherein $R^{19}$ is a tetravalent organic group, $R^{20}$ is a bivalent to tetravalent organic group, $R^{21}$ is hydrogen or an organic group having a carbon number of 1 to 20, $R^{22}$ is a bivalent organic group, X and Y each are a bivalent to octavalent organic group having at least one group selected from a carboxyl group, a phenolic hydroxyl group, a sulfonic acid group, and a thiol group, n1 is an integer between 10 and 100000, and m1 is an integer between 0 to 10).

These have an alkali-soluble group other than a carboxyl group derived from the polyamic acid either inside the polymer primary chain or at the ends of the polymer primary chain. Because of the presence of the alkali-soluble group, the solubility in an alkali aqueous solution can be higher than that of the polyamic acid ester and/or polyamic acid having no alkali-soluble group.

The structure represented by formula (3) above has an alkali-soluble group, other than the carboxyl group derived from the polyamic acid, inside the primary chain of the polymer.

Among the alkali-soluble groups, phenolic hydroxyl groups are preferred for their excellent solubility in alkaline aqueous solutions. Moreover, when the structure of formula (3) contains 10 percent by weight or more of fluorine, a suitable degree of water repellency is exhibited during development with an alkaline aqueous solution, thereby preventing leakage at the interface. However, at a fluorine content exceeding 20 percent by weight, the solubility in an alkaline aqueous solution decreases, the polymer having a cyclic structure by heating exhibits a lower resistance to an organic solvent, and the solubility in fuming nitric acid is degraded, which is undesirable. The preferable fluorine content is therefore 10 to 20 percent by weight.

In formula (3) above, $R^3$ represents the structure component of an acid dianhydride. Preferably, the acid dianhydride is a bivalent to octavalent organic group comprising an aromatic ring, one to four hydroxyl groups, and at least two carbon atoms. More preferably, the dianhydride is a trivalent or tetravalent organic group of carbon number of 6 to 30.

In particular, a structure represented by formula (4) below is preferred:

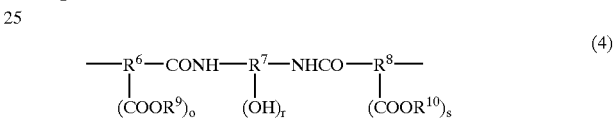

Preferably, $R^6$ and $R^8$ each contain an aromatic ring for improving the heat resistance of the resulting polymer; particularly preferred structures are those of trimellitic acid, trimesic acid, naphthalene tricarboxylic acid resident, or the like. Moreover, $R^7$ is preferably a trivalent to hexavalent organic group containing a hydroxyl group having a carbon number of 3 to 20. The hydroxyl group is preferably next to an amide bond. Examples thereof include bis(3-amino-4-hydroxyphenyl)hexafluoropropane, bis(3-hydroxy-4-aminophenyl)hexafluoropropane, which contain fluorine, and bis(3-amino-4-hydroxyphenyl)propane, bis(3-hydroxy-4-aminophenyl)propane, 3,3'-diamino-4,4'-dihydroxybiphenyl, 3,3'-diamino-4,4'-dihydroxybiphenyl, 2,4-diamino-phenol, 2,5-diaminophenol, and 1,4-diamino-2,5-dihydroxybenzene, which contain no fluorine, having a bonded amino group.

$R^9$ and $R^{10}$ may be the same or different and each are preferably hydrogen or an organic group having a carbon number of 1 to 20. A carbon number of exceeding 20 decreases the solubility in an alkaline developer. Each of o and s represents 1 or 2, and r represents an integer between 1 and 4. An r of 5 or more degrades the properties of the resulting heat-resistant resin film.

Nonlimiting examples of preferable compounds among the compounds represented by formula (4), i.e., $R^3(COOR^5)_m(OH)_p$ in formula (3), are as follows:

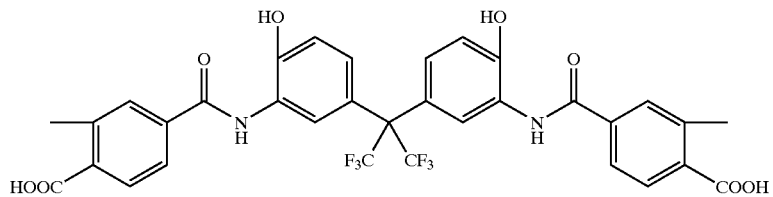

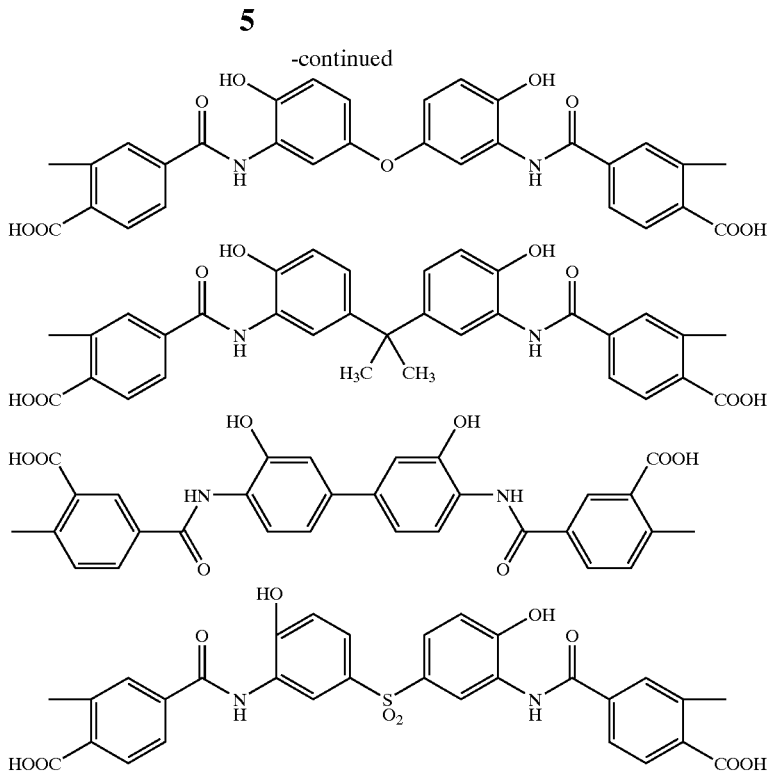

Modification by a tetracarboxylic acid or a dicarboxylic acid having no hydroxyl group is also possible as long as the alkali solubility, the photosensitivity, and the heat resistance are not impaired. Examples thereof include aromatic tetracarboxylic acids, such as pyromellitic acid, benzophenonetetracarboxylic acid, biphenyltetracarboxylic acid, or diphenyltetracarboxylic acid, or a diester compound thereof in which two carboxylic groups are replaced with methyl groups or ethyl groups; aliphatic tetracarboxylic acid, such as butanetetracarboxylic acid or cyclopentanetetracarboxylic acid, or a diester compound thereof in which two carboxylic groups are replaced with methyl groups or ethyl groups; aromatic dicarboxylic acid such as terephthalic acid, isophthalic acid, diphenyl ether dicarboxylic acid, or naphthalene dicarboxylic acid; and aliphatic dicarboxylic acid such as adipic acid. Preferably, 50 molar percent or less, and more preferably 30 molar percent or less of the acid component is modified. Modification of 50 molar percent or more impairs the alkali solubility and the photosensitivity.

In formula (3) above, $R^4$ represents a structure component of diamine. The preferable examples of $R^4$ are those having hydroxyl groups and aromatics for heat resistance of the resulting polymer. Specific examples are bis(amino-hydroxy-phenyl)hexafluoropropane, which contains fluorine, diamino dihydroxypyrimidine, diamino dihydroxypyridine, hydroxy-diamino-pyrimidine, diaminophenol, and dihydroxybenzidine, which are fluorine-free compounds, and compounds having the structures represented by formulae (5) to (7):

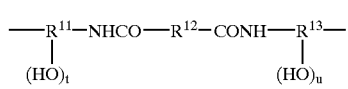 (5)

(wherein $R^{11}$ and $R^{13}$ each represent a trivalent or tetravalent organic group containing hydroxyl groups and having a carbon number of 2 to 20, $R^{12}$ represents a bivalent organic group having a carbon number of 2 to 30, and t and u each represent 1 or 2);

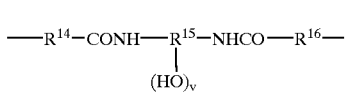 (6)

(wherein $R^{14}$ and $R^{16}$ each represent a bivalent organic group having a carbon number of 2 to 20, $R^{15}$ represents a trivalent to hexavalent organic group containing hydroxyl groups and having a carbon number of 3 to 20, and v is an integer between 1 and 4); and

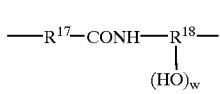 (7)

(wherein $R^{17}$ is a bivalent organic group having a carbon number of 2 to 20, $R^{18}$ is a trivalent to hexavalent organic group containing hydroxyl groups and having a carbon number of 3 to 20, and w represents an integer between 1 and 4).

Among these compounds, preferably, $R^{11}$ and $R^{13}$ in formula (5), $R^{15}$ in formula (6), and $R^{18}$ in formula (7) are each an organic group containing a hydroxyl group and an aromatic ring for heat resistance of the resulting polymer. Preferably, $R^{12}$ in formula (5), $R^{14}$ and $R^{16}$ in formula (6), and $R^{17}$ in formula (7) are each an organic group having an aromatic ring for heat resistance of the resulting polymer. In formula (5), t and u each represents an integer of 1 or 2, and v in formula (6) and w in formula (7) each represent an integer in between 1 and 4.

Specific examples of $R^4(OH)_q$ in formula (3) as represented by formula (5) are as follows:

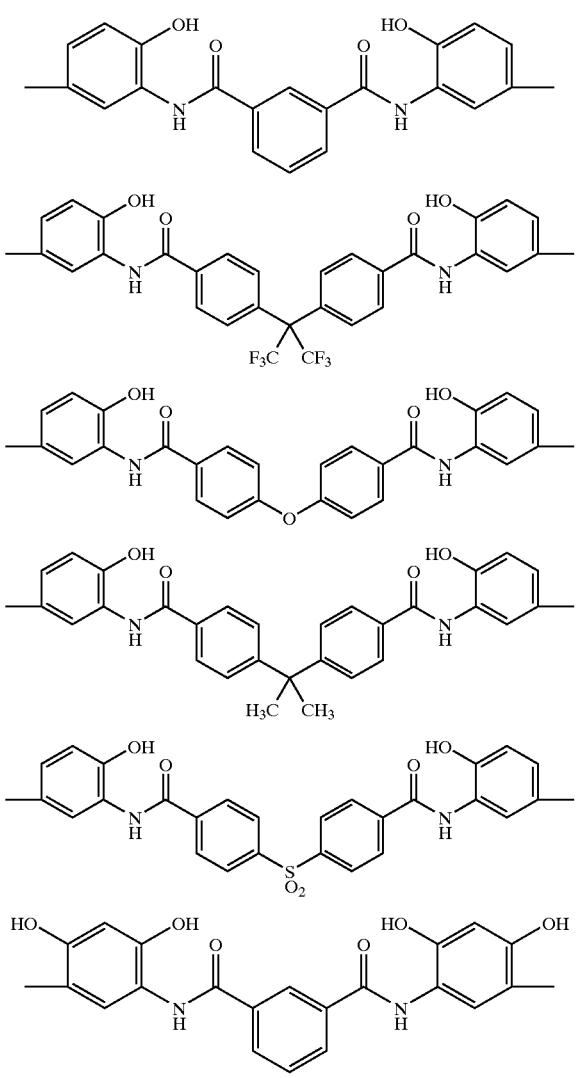

Specific examples of $R^4(OH)_q$ in formula (3) as represented by formula (6) are as follows:

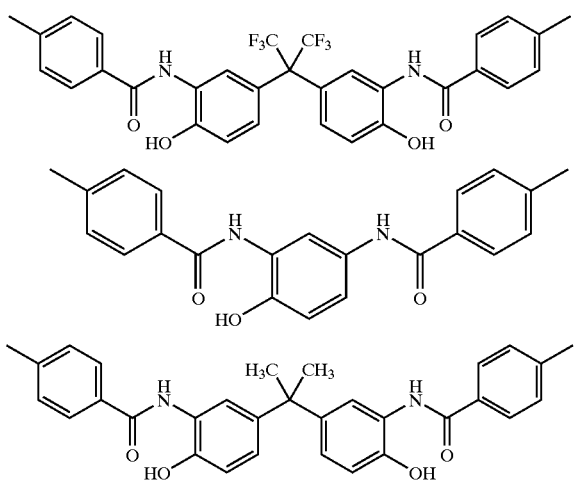

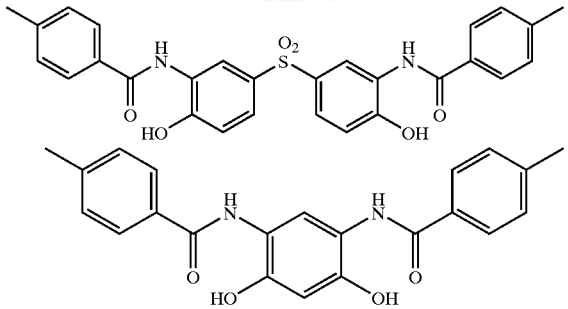

Specific examples of $R^4(OH)_q$ in formula (3) as represented by formula (7) are as follows:

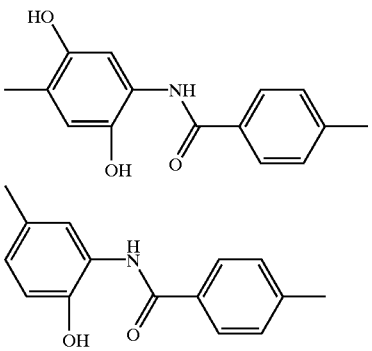

In formula (5), $R^{11}$ and $R^{13}$ each represent a trivalent or tetravalent organic group containing a hydroxyl group and having a carbon number of 2 to 20 and preferably contain an aromatic ring for heat resistance of the resulting polymer. Examples thereof are a hydroxyphenyl group, a dihydroxyphenyl group, a hydroxynaphthyl group, a dihydroxynaphthyl group, a hydroxybiphenyl group, a dihydroxybiphenyl group, a bis(hydroxyphenyl)hexafluoropropane group, a bis(hydroxyphenyl)propane group, a bis(hydroxyphenyl)sulfone group, a hydroxydiphenylether group, and a dihydroxydiphenylether group. Alternatively, an aliphatic group such as a hydroxycyclohexyl group or a dihydroxycyclohexyl group may be employed. $R^{12}$ represents a bivalent organic group having a carbon number of 2 to 30. Preferably, the bivalent organic group includes an aromatic for heat resistance of the resulting polymer. Examples thereof are a phenyl group, a biphenyl group, a diphenylether group, a diphenylhexafluoropropane group, diphenylpropane group, and diphenylsulfone group. Alternatively, an aliphatic cyclohexyl group may be employed.

In formula (6), $R^{14}$ and $R^{16}$ each represent a bivalent organic group having a carbon number of 2 to 20. The bivalent group preferably includes an aromatic for the heat resistance of the resulting polymer. Examples thereof are a phenyl group, a biphenyl group, a diphenylether group, a diphenylhexafluoropropane group, a diphenylpropane group, and a diphenylsulfone group. Alternatively, an aliphatic cyclohexyl group may be employed. $R^{15}$ represents a trivalent to hexavalent organic group containing a hydroxyl group and having a carbon number of 3 to 20 and preferably includes an aromatic ring for the heat resistance of the resulting polymer. Specific examples are a hydroxyphenyl group, a dihydroxyphenyl group, a hydroxynaphthyl group, a dihydroxynaphthyl group, a hydroxybiphenyl group, a dihydroxybiphenyl group, a bis(hydroxyphenyl)hexafluoropropane group, a bis(hydroxyphenyl)propane group, a bis(hydroxyphenyl)sulfone group, a hydroxydiphenylether group, and a dihydroxydiphenylether group. Alternatively, an aliphatic group such as a hydroxycyclohexyl group or a dihydroxycyclohexyl group may be employed.

In formula (7), $R^{17}$ represents a bivalent organic group having a carbon number of 2 to 20. A bivalent group preferably contains an aromatic for the heat resistance of the resulting polymer. Examples thereof are a phenyl group, a biphenyl group, a diphenylether group, a diphenylhexafluoropropane group, a diphenylpropane group, and a diphenylsulfone group. Alternatively, an aliphatic cyclohexyl group or the like may be employed. $R^{18}$ represents a trivalent to hexavalent organic group containing a hydroxyl group and having a carbon number of 3 to 20 and preferably contains an aromatic ring for the heat resistance of the resulting polymer. Examples thereof are a hydroxyphenyl group, a dihydroxyphenyl group, a hydroxynaphthyl group, a dihydroxynaphthyl group, a hydroxybiphenyl group, a dihydroxybiphenyl group, a bis(hydroxyphenyl) hexafluoropropane group, a bis(hydroxylphenyl)propane group, a bis(hydroxyphenyl)sulfone group, a hydroxydiphenylether group, and a dihydroxydiphenylether group. Alternatively, an aliphatic group such as a hydroxycyclohexyl group or a dihydroxycyclohexyl group may be employed.

Alternatively, 1 to 40 molar percent of another diamine component may be used to perform modification. Examples thereof are phenylenediamine, diaminodiphenyl ether aminophenoxybenzene, diaminodiphenylmethane, diaminodiphenylsulfone, bis(trifluoromethyl)benzidine, bis(aminophenoxyphenyl)propane, bis(amonophenoxyphenyl)sulfone, and compounds made by substituting aromatic rings of these substances with alkyl groups or halogen atoms. Examples thereof are phenylenediamine, diaminodiphenyl ether, aminophenoxybenzene, diaminodiphenylmethane, diaminodiphenylsulfone, bis(trifluoromethyl)benzidine, bis(aminophenoxyphenyl)propane, bis(aminophenoxyphenyl)sulfone, compounds made by substituting aromatic rings of these substances with alkyl groups or halogen atoms, and aliphatics such as cyclohexyldiamine, methylenebiscyclohexylamine, and the like. If more than 40 molar percent of such a diamine component is copolymerized, the heat resistance of the resulting polymer decreases.

In formula (3), $R^5$ represents hydrogen or an organic group having a carbon number of 1 to 20. In view of the stability of the resulting positive photosensitive resin precursor solution, $R^5$ is preferably an organic group; however, in view of the solubility in an alkaline aqueous solution, hydrogen is preferred. In the present invention, hydrogen atoms and alkyl groups may exist simultaneously. The dissolving rate in an alkaline aqueous solution changes by controlling the amount of hydrogen and the organic group in $R^5$; thus, a positive photosensitive resin precursor composition having an adequate dissolving rate can be obtained by such a control. Preferably, 10 to 90 percent of $R^5$ is hydrogen atoms. When the carbon number of $R^5$ exceeds 20, the resulting substance does not dissolve in an alkaline aqueous solution. In view of the above, $R^5$ preferably contains at least one hydrocarbon group having a carbon number of 1 to 16, the balance being hydrogen atoms.

In formula (3), m represents the number of carboxyl groups and is an integer between 0 and 2. In formula (3), n represents the number of repeating structure units in the polymer of the present invention, which is in the range of 10 to 100000.

Instead of the polyamic acid, polyhydroxyamide may be used as the heat-resistant polymer precursor similar to the polyamic acid. Polyhydroxyamide can be made by a condensation reaction between a bisaminophenol compound and a dicarboxylic acid. Specific examples of methods are a method of allowing acid to react with a dehydrating agent, such as dicyclohexylcarbodiimide (DCC), and adding a bisaminophenol compound thereto and a method of adding a tertiary amine, such as pyridine, to a bisaminophenol compound to form a solution and dropping a dicarboxylic acid chloride solution to this solution.

In using polyhydroxyamide, a sensitizer such as naphthoquinone diazide sulfonic acid ester is added to a polyhydroxyamide solution so as to obtain a positive photosensitive heat-resistant resin precursor composition, the UV-exposed portion of which can be removed by an alkaline aqueous solution.

In order to enhance the adhesion to the substrate, $R^3$ and $R^4$ in formula (3) may be copolymerized with an aliphatic group having a siloxane structure as long as the heat resistance is not decreased. Specific examples thereof are those prepared by copolymerizing 1 to 10 molar percent of bis(3-aminopropyl)tetramethyldisiloxane, bis(p-aminophenyl) octamethylpentasiloxane, or the like, as the diamine component.

Among the components (a) of the present invention, those having an alkali-soluble group inside the polymer primary chain may be constituted from either only the structural unit represented by formula (3) or a copolymer or a mixture with another structural unit. In such a case, 90 molar percent or more of the structural unit represented by formula (3) is preferably contained. The type and amount of the structural unit in the copolymer or the mixture are preferably selected within the range that does not impair the heat resistance of the polyimide polymer resulting from final heat treatment.

The polymer of the present invention represented by formula (3) above is synthesized according to a well-known method. Examples of the methods are a method of allowing the tetracarboxylic dianhydride to react with a diamine compound at a low temperature, a method of obtaining a diester from tetracarboxylic dianhydride and alcohol and allowing the diester to react with amine in the presence of a condensing agent, a method of obtaining a diester from tetracarboxylic dianhydride and alcohol, chloridizing the remaining dicarboxylic acid, and allowing the resulting carboxylic chloride to react with the amine.

The polymers of formulae (8) to (11) of the present invention have alkali-soluble groups, other than the carboxyl groups derived from the polyamic acid, at the ends of the polymer primary chain.

In formulae (8) to (11), $R^{19}$ represents a structural component of an acid dianhydride. This acid dianhydride is a tetravalent organic group containing an aromatic ring or an aliphatic ring. The organic group preferably contains 5 to 40 carbon atoms.

Examples of the acid dianhydride are aromatic tetracarboxylic dianhydrides such as pyromellitic dianhydride, 3,3', 4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3- dicarboxyphenyl)methane dianhydride, bis(3,4-dicarboxyphenyl)sulfone dianhydride, bis(3,4-dicarboxyphenyl)ether dianhydride, 1,2,5,6-naphthalenetetracarboxylic dianhydride, 2,3,6,7-naphthalenetetracarboxylic dianhydride, 2,3,5,6-pyridinetetracarboxylic dianhydride, 3,4,9,10-perylenetetracarboxylic dianhydride, and 2,2-bis(3,4-dicarboxyphenyl)hexafluoropropane dianhydride, and aliphatic tetracarboxylic dianhydrides such as butanetetracarboxylic dianhydride and 1,2,3,4-cyclopentanetetracarboxylic dianhydride. Among these, 3,3',4,4'-biphenyltetracarboxylic dianhydride, 2,3,3',4'-biphenyltetracarboxylic dianhydride, 2,2',3,3'-biphenyltetracarboxylic dianhydride 3,3',4,4'-benzophenonetetracarboxylic dianhydride, 2,2',3,3'-benzophenonetetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)sulfone dianhydride, bis(3,4-dicarboxyphenyl)ether dianhydride, and 2,2-bis(3,4-dicarboxyphenyl)hexafluoropropane dianhydride are particularly preferred.

These may be used alone or in combination.

In formulae (8) to (11) above, $R^{20}$ represents a structural component of a diamine. The diamine is preferably a bivalent to tetravalent organic group containing an aromatic ring or an aliphatic ring. The organic group preferably contains 5 to 40 carbon atoms.

Examples of the diamine are 3,4'-diaminodiphenyl ether, 4,4'-diaminodiphenyl ether, 3,4'-diaminodiphenyl methane, 4,4'-diaminodiphenyl methane, 3,4'-diaminodiphenyl sulfone, 4,4'-diaminodiphenyl sulfone, 3,4'-diaminodiphenyl sulfide, 4,4'-diaminodiphenyl sulfide, 1,4-bis(4-aminophenoxy)benzene, benzine, m-phenylenediamine, P-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis{4-(4-aminophenoxy)phenyl}ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, compounds obtained by substituting aromatic rings of these substances with alkyl groups or halogen atoms, and aliphatics such as cyclohexyldiamine and methylene bis cyclohexylamine.

Among these, 3,4'-diaminodiphenyl ether, 4,4'-diaminodiphenyl ether, 3,4'-diaminodiphenyl methane, 4,4'-diaminodiphenyl methane, 3,4'-diaminodiphenyl sulfone, 4,4'-diaminodiphenyl sulfone, 3,4'-diaminodiphenyl sulfide, 4,4'-diaminodiphenyl sulfide, m-phenylenediamine, P-phenylenediamine, and 1,4-bis(4-aminophenoxy)benzene are preferred. Yet more preferable examples are 3,4'-diaminodiphenyl ether, 4,4'-diaminodiphenyl ether, 3,4'-diaminodiphenyl methane, 4,4'-diaminodiphenyl methane, 3,4'-diaminodiphenyl sulfone, 4,4'-diaminodiphenyl sulfone, and 1,4-bis(4-aminophenoxy)benzene. They may be used alone or in combination.

In formulae (8) to (11) above, $R^{21}$ represents hydrogen or an organic group having a carbon number of 1 to 20. Preferably, $R^{21}$ is an organic group from the point of view of the stability of the resulting positive photosensitive resin precursor solution; however, hydrogen is preferable from the point of view of the solubility in an alkaline aqueous solution. In the present invention, hydrogen atoms and alkyl groups may exist simultaneously. By controlling the amounts of hydrogen and the organic groups in $R^{21}$, the dissolving rate in an alkaline aqueous solution changes. Thus, a positive photosensitive resin precursor composition having an adequate dissolving rate can be obtained by such a control. Preferably, 10 to 90 percent of $R^{21}$ is hydrogen atoms. At a carbon number of $R^{21}$ exceeding 20, $R^{21}$ does not dissolve in an alkaline aqueous solution. In view of the above, $R^{21}$ preferably contains at least one hydrocarbon group having a carbon number of 1 to 16, the balance being hydrogen atoms.

Preferably, —NH—$(R^{22})_{m1}$—X, which is a structure component in formulae (8) and (9), is represented by formula (12) below. The substances represented herein are derivatives of a primary monoamine, which is an end sealant. Preferably, X is a bivalent to octavalent organic group containing at least one group selected from a phenolic hydroxyl group, a sulfonic acid group, and a thiol group. More preferably, X is a bivalent to octavalent organic group containing at least one group selected from a phenolic hydroxyl group and a thiol group.

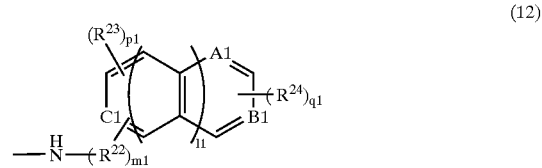
(12)

In formulae (10) and (11) above, the structural component —CO—$(R^{22})_{m1}$—Y is preferably represented by formula (12) and/or (13), which is a component derived from any selected one of an acid anhydride, a monocarboxylic acid, a monoacid chloride compound, and a monoactivated ester compound. Preferably, Y is a bivalent to octavalent organic group containing at least one group selected from a carboxyl group, a phenolic hydroxyl group, a sulfonic acid group, and a thiol group. More preferably, Y is a bivalent to octavalent organic group containing at least one group selected from a phenolic hydroxyl group and a thiol group. In formulae (10) and (11), Y may include only an endcap group represented by formula (13), only an end sealing group represented by formula (14), or both groups represented by formulae (13) and (14).

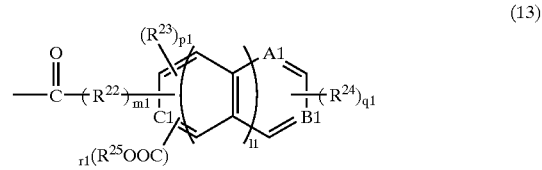
(13)

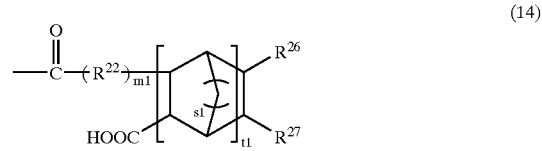
(14)

In formulae (12) to (14), $R^{22}$ represents a bivalent group selected from —$CR^{28}R^{29}$—, —$CH_2O$—, and —$CH_2SO_2$—, and $R^{28}$ and $R^{29}$ each represent a monovalent group selected from a hydrogen atom, a hydroxyl group, and a hydrocarbon group having a carbon number of 1 to 10. $R^7$ represents a monovalent group selected from a hydrogen atom and C1–C10 hydrocarbon groups and is preferably a hydrogen atom or a hydrocarbon group having a carbon number of 1 to 4. A hydrogen atom, a methyl group, and a t-butyl group are particularly preferable. $R^{26}$ and $R^{27}$ each represent a monovalent group selected from a hydrogen atom and one hydrocarbon group having a carbon number of 1 to 4 or a ring structure, e.g., a nadiimide ring, that directly bonds $R^{26}$ to $R^{27}$. $R^{23}$ and $R^{24}$ are each selected from a hydrogen atom, a hydroxyl group, a carboxyl group, a sulfonic acid group, a thiol group, and one hydrocarbon group having a carbon number of 1 to 10. At least one of $R^{23}$ and $R^{24}$ is a hydroxyl group, a carboxyl group, a sulfonic acid group, or a thiol group. A1, B1, and C1 are carbon atoms or nitrogen atoms, they may all be carbon or nitrogen atoms, or a mixture of carbon and nitrogen atoms; m1 is an integer between 0 and 10, and more preferably, 0 and 4; 11 is 0 or 1, and preferably 0; p1 is 0 or 1, and preferably 0; q1 is an integer between 1 and 3, and preferably 1 and 2; and r1, s1, and t1 are each 0 or 1.

Regarding formula (12), specific examples of the primary monoamines are 5-amino-8-hydroxyquinoline, 4-amino-8-hydroxyquinoline, 1-hydroxy-8-aminonaphthalene, 1-hydroxy-7-aminonaphthalene, 1-hydroxy-6-aminonaphthalene, 1-hydroxy-5-aminonaphthalene, 1-hydroxy-4-aminonaphthalene, 1-hydroxy-3-aminonaphthalene, 1-hydroxy-2-aminonaphthalene, 1-amino-7-hydroxynaphthalene, 2-hydroxy-7-aminonaphthalene, 2-hydroxy-6-aminonaphthalene, 2-hydroxy-5-aminonaphthalene, 2-hydroxy-4-aminonaphthalene, 2-hydroxy-3-aminonaphthalene, 1-amino-2-hydroxynaphthalene, 1-carboxy-8-aminonaphthalene, 1-carboxy-7-aminonaphthalene, 1-carboxy-6-aminonaphthalene, 1-carboxy-5-aminonaphthalene, 1-carboxy-4-aminonaphthalene, 1-carboxy-3-aminonaphthalene, 1-carboxy-2-aminonaphthalene, 1-amino-7-carboxynaphthalene, 2-carboxy-7-aminonaphthalene, 2-carboxy-6-aminonaphthalene, 2-carboxy-5-aminonaphthalene, 2-carboxy-4-aminonaphthalene, 2-carboxy-3-aminonaphthalene, 1-amino-2-carboxynaphthalene, 2-aminonicotinic acid, 4-aminonicotinic acid, 5-aminonicotinic acid, 6-aminonicotinic acid, 4-aminosalicylic acid, 5-aminosalicylic acid, 6-aminosalicylic acid, 3-amino-o-toluic acid, ammelide, 2-aminobenzoic acid, 3-aminobenzoic acid, 4-aminobenzoic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 5-amino-8-mercaptoquinoline, 4-amino-8-mercaptoquinoline, 1-mercapto-8-aminonaphthalene, 1-mercapto-7-aminonaphthalene, 1-mercapto-6-aminonaphthalene, 1-mercapto-5-aminonaphthalene, 1-mercapto-4-aminonaphthalene, 1-mercapto-3-aminonaphthalene, 1-mercapto-2-aminonaphthalene, 1-amino-7-mercaptonaphthalene, 2-mercapto-7-aminonaphthalene, 2-mercapto-6-aminonaphthalene, 2-mercapto-5-aminonaphthalene, 2-mercapto-4-aminonaphthalene, 2-mercapto-3-aminonaphthalene, 1-amino-2-mercaptonaphthalene, 3-amino-4,6-dimercaptopyrimidine, 2-aminothiophenol, 3-aminothiophenol, 4-aminothiophenol, and so on.

Among these, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, and 4-aminothiophenol are particularly preferred. These may be used alone or in combination.

Regarding formulae (13) and (14), examples of the acid anhydride, the monocarboxylic acid, the monoacid chloride compound, and the monoactivated ester compound are acid anhydrides such as phthalic anhydride, maleic anhydride, nadic acid, cyclohexanedicarboxylic anhydride, 3-hydroxyphthalic anhydride, and the like; monocarboxylic acids such as 2-carboxyphenol, 3-carboxyphenol, 4-carboxyphenol, 2-carboxythiophenol, 3-carboxythiophenol, 4-carboxythiophenol, 1-hydroxy-8-carboxynaphthalene, 1-hydroxy-7-carboxynaphthalene, 1-hydroxy-6-carboxynaphthalene, 1-hydroxy-5-carboxynaphthalene, 1-hydroxy-4-carboxynaphthalene, 1-hydroxy-3-carboxynaphthalene, 1-hydroxy-2-carboxynaphthalene, 1-mercapto-8-carboxynaphthalene, 1-mercapto-7-carboxynaphthalene, 1-mercapto-6-carboxynaphthalene, 1-mercapto-5-carboxynaphthalene, 1-mercapto-4-carboxynaphthalene, 1-mercapto-3-carboxynaphthalene, 1-mercapto-2-carboxynaphthalene, 2-carboxybenzenesulfonic acid, 3-carboxybenzenesulfonic acid, 4-carboxybenzenesulfonic acid, and the like, and monoacid chloride compounds of these substances in which carboxylic groups thereof are chloridized; monoacid chloride compounds obtained by chloridizing monocarboxyl groups of dicarboxylic acids such as terephthalic acid, phthalic acid, maleic acid, cyclohexanedicarboxylic acid, 3-hydroxyphthalic acid, 5-norbornene-2,3-dicarboxylic acid, 1,2-dicarboxynaphthalene, 1,3-dicarboxynaphthalene, 1,4-dicarboxynaphthalene, 1,5-dicarboxynaphthalene, 1,6-dicarboxynaphthalene, 1,7-dicarboxynaphthalene, 1,8-dicarboxynaphthalene, 2,3-dicarboxynaphthalene, 2,6-dicarboxynaphthalene, 2,7-dicarboxynaphthalene, and the like; and activated ester compounds obtained by the reaction between a monoacid chloride compound and one of n-hydroxybenzotriazole and N-hydroxy-5-norbornene-2,3-dicarboxyimide.

Among these, particularly preferred examples are acid anhydrides such as phthalic anhydride, maleic anhydride, nadic acid, cyclohexanedicarboxylic anhydride, and 3-hydroxyphthalic anhydride; monocarboxylic acids such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid, and 4-carboxybenzenesulfonic acid, and monoacid chloride compounds of these substances in which carboxylic groups thereof are chloridized; monoacid chloride compounds obtained by chloridizing monocarboxyl groups of dicarboxylic acids such as terephthalic acid, phthalic acid, maleic acid, cyclohexanedicarboxylic acid, 1,5- dicarboxynaphthalene, 1,6-dicarboxynaphthalene, 1,7-dicarboxynaphthalene, and 2,6-dicarboxynaphthalene; and activated ester compounds obtained by the reaction between a monoacid chloride compound and one of N-hydroxybenzotriazole and N-hydroxy-5-norbornene-2,3-dicarboxyimide. These may be used alone or in combination.

The amount of the introduced component represented by formula (12), i.e., the component X in formulae (8) and (9), is preferably in the range of 0.1 to 60 molar percent, and more preferably 5 to 50 molar percent relative to the entirety of the amine component when calculated based on the primary monoamine component which is the original component functioning as the endcap agent.

The amount of the introduced component represented by formulae (13) and (14), i.e., the component Y in formulae (10) and (11), is preferably in the range of 0.1 to 60 molar percent, and more preferably 5 to 55 molar percent relative to the diamine component when calculated based on the acid anhydride, the monocarboxylic acid, the monoacid chloride compound, or the monoactive ester compound, which is the original component functioning as the endcap agent.

In formulae (8) and (9) or (10) and (11), nn represents the number of repeating structure units of the polymer of the present invention and is preferably in the range of 10 to 100000.

In order to improve the adhesion to the substrate, $R^{19}$ and $R^{20}$ may be copolymerized with an aliphatic group having a siloxane structure to an extent that does not decrease the thermal resistance. In particular, examples are those obtained by copolymerizing 1 to 10 molar percent of bis(3-aminopropyl)tetramethyldisiloxane, bis(p-aminophenyl)octamethylpentasiloxane, or the like as the diamine component.

Among the polymer of the component (a) of the present invention, those having alkali-soluble groups at the ends of the polymer primary chain may be constituted only from structural units represented by either formula (8) and/or formula (9) or formula (10) and/or formula (11). Alternatively, they may be copolymerized or mixed with other structural units. In such a case, the amount of the structural unit represented by formula (8) and/or formula (9) or by formula (10) and/or formula (11) is preferably 50 molar percent or more of the copolymer or the mixture. The type and the amount of the structural unit used in the copolymerization or the mixture are preferably selected from within a range that does not impair the heat resistance of the polyimide polymers obtained by final heat treatment.

The polymer of the component (a) of the present invention represented by formulae (8) to (11) above is synthesized by a known method which replaces part of a diamine with a monoamine endcap agent or which replaces the acid dianhydride with an endcap agent comprising a monocarboxylic acid, an acid anhydride, a monoacid chloride compound, or a monoactive ester compound. Examples of such methods are a method of allowing tetracarboxylic dianhydride to react with a diamine compound (part of which is substituted by a monoamine endcap agent) at a low temperature; a method of allowing tetracarboxylic dianhydride (part of which is substituted with an end sealant comprising an acid anhydride, a monoacid chloride compound, or a monoactive ester compound) to react with a diamine compound; a method of allowing diester, which is obtained from tetracarboxylic dianhydride and alcohol, to react with diamine (part of which is substituted by a monoamine endcap agent) in the presence of a condensing agent; and a method including obtaining diester from tetracarboxylic dianhydride and alcohol, chloridizing the remaining dicarboxylic acid, and allowing the chloridized dicarboxylic acid to react with diamine (part of which is substituted with a monoamine endcap agent).

The endcap agent which is introduced into the polymer and used in the present invention can be readily detected through the method described below. For example, the polymer containing the endcap agent is dissolved in an acidic solution so as to be decomposed into the acid anhydride components and amine components, which are the structure units of the polymer. Subsequently, gas chromatography (GC) or nuclear magnetic resonance (NMR) analysis is performed to detect the endcap agent used in the present invention. Another example method for easily detecting the endcap agent is directly performing pyrolysis gas chromatography (PGC), or infrared spectrum and C13 NMR spectrum investigation on the polymer component containing the endcap agent.

The main component of the polymer of the component (a) of the present invention is the structure unit represented by formulae (3) and (8) to (11) described above. Preferably, the main component is the structure unit represented by formula (3) above.

More preferably, the main component includes the structure unit represented by formula (3) and at least one structure unit selected from those represented by formulae (8) and (11) above, as the main component.

In such a case, the structural unit represented by formula (3) may be copolymerized or mixed with the unit structures represented by formulae (8) to (11) above. Here, preferably 1 molar percent or more, and more preferably 5 molar percent or more of the unit represented by formula (3) above is contained.

Examples of the thermally crosslinkable compound containing the group represented by formula (1) used in the present invention are, as those having one of such an organic group, ML-26X, ML-24X, ML-236TMP, 4-methylol3M6C, ML-MC, and ML-TBC (trade names, manufactured by Honshu Chemical Industry Co., Ltd.); as those having two of such an organic group, DM-BI25X-F, 46DMOC, 46DMOIPP, 46DMOEP (trade names, manufactured by Asahi Organic Chemicals Industry Co., Ltd.), DML-MBPC, DML-MBOC, DML-OCHP, DML-PC, DML-PCHP, DML-PTBP, DML-34X, DML-EP, DML-POP, DML-OC, dimethylol-Bis-C, dimethylol-BisOC-P, DML-BisOC-Z, DML-BisOCHP-Z, DML-PFP, DML-PSBP, DML-MB25, DML-MTrisPC, EML-Bis25X-34XL, DML-Bis25X-PCHP (trade names, manufactured by Honshu Chemical Industry Co., Ltd.), Nikalac MX-290 (trade name, manufactured by Sanwa Chemical Co., Ltd.), 2,6-dimethoxymethyl-4-t-butylphenol, 2,6-dimethoxymethyl-p-cresol, 2,6-diacetoxymethyl-p-cresol, and the like; as those having three of such an organic group, TriML-P, TriML-35XL, TriML-TrisCr-HAP (trade names, manufactured by Honshu Chemical Industry Co., Ltd.) and the like; as those having four of such an organic group, TM-BIP-A (trade name, manufactured by Asahi Organic Chemicals Industry Co., Ltd.), TML-BP, TML-HQ, TML-pp-BPF, TML-BPA, TMOM-BP (trade names, manufactured by Honshu Chemical Industry Co., Ltd.), Nikalac MX-280, Nikalac MX-270 (trade names, manufactured by Sanwa Chemical Co., Ltd.); and as those having six of such an organic group, HML-TPPHBA and HML-TPHAP (trade names, manufactured by Honshu Chemical Industry Co., Ltd.).

Among these, those including at least two of the group represented by formula (1) are preferable. Particularly preferable examples are, as those having two of such a group, 46DMOC, 46DMOEP (trade names, manufactured by Asahi Organic Chemicals Industry Co., Ltd.), DML-MBPC, DML-MBOC, DML-OCHP, DML-PC, DML-PCHP, DML-PTBP, DML-34X, DML-EP, DML-POP, dimethylol-BisOC-P, DML-PFP, DML-PSBP, DML-MTrisPC (trade names, manufactured by Honshu Chemical Industry Co., Ltd.), Nikalac MX-290 (trade name, manufactured by Sanwa Chemical Co., Ltd.), 2,6-dimethoxymethyl-4-t-butylphenol, 2,6-dimethoxymethyl-p-cresol, and 2,6-diacetoxymethyl-p-cresol; as those having three of such a group, TriML-P and TriML-35XL, (trade names, manufactured by Honshu Chemical Industry Co., Ltd.); as those having four of such a group, TM-BIP-A (trade name, manufactured by Asahi Organic Chemicals Industry Co., Ltd.), TML-BP, TML-HQ, TML-pp-BPF, TML-BPA, TMOM-BP (trade names, manufactured by Honshu Chemical Industry Co., Ltd.), Nikalac MX-280, Nikalac MX-270 (trade names, manufactured by Sanwa Chemical Co., Ltd.); and as those having six of such an organic group, HML-TPPHBA and HML-TPHAP (trade names, manufactured by Honshu Chemical Industry Co., Ltd.). Yet more preferable examples are Nikalac MX-280 and Nikalac MX-270 (trade names, manufactured by Sanwa Chemical Co., Ltd.) having the group represented by formula (2) above.

When these thermally crosslinkable compounds are added, the resulting resin composition hardly dissolves in an alkaline developing solution before exposure but readily dissolves in the alkaline developing solution after exposure. Thus, the layer thickness does not decrease due to development, development can be completed in a short time, and the shrinkage ratio after curing becomes small.

When the thermally crosslinkable compounds containing the group represented by formula (2) are used, the absorption of light having the exposure wavelength is extremely small compared with aromatic thermally crosslinkable compounds. Thus, the sensitizer can function efficiently during exposure, thereby allowing the composition to readily dissolve in the alkaline developing solution and completing the development in a short time. Moreover, since they belong to the alicyclic system, a superior heat resistance can be obtained compared with those of the aliphatic system.

These crosslinkable compounds form crosslinks by a reaction mechanism that bonds directly to benzene rings shown below:

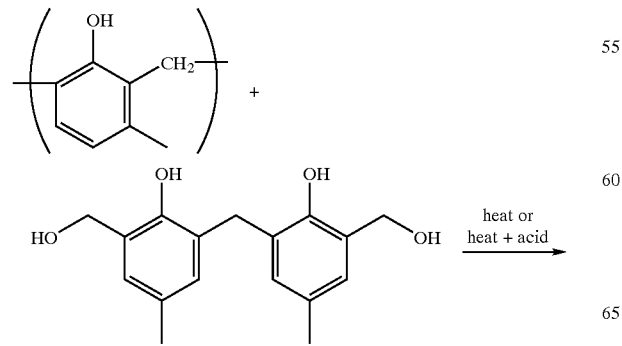

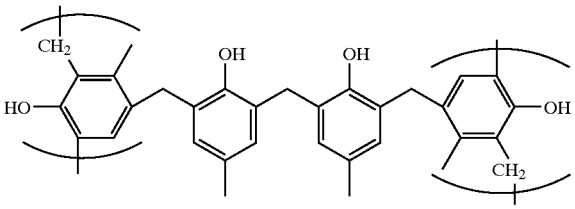

The structures of representative examples of additive thermally crosslinkable compounds suitable for the present invention are shown below:

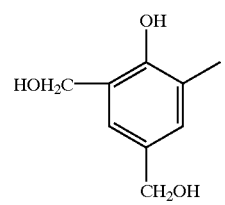

46DMOC

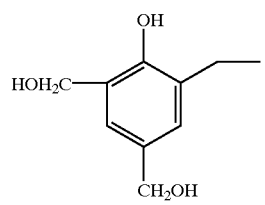

46DMOEP

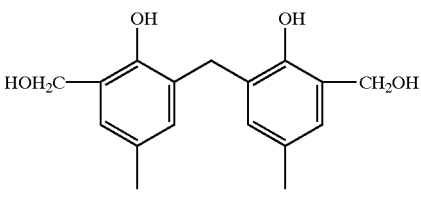

DML-MBPC

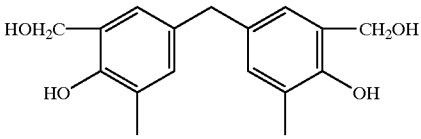

DML-MBOC

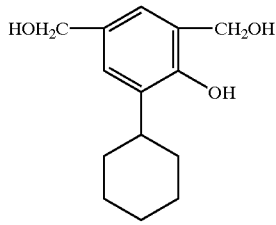

DML-OCHP

-continued
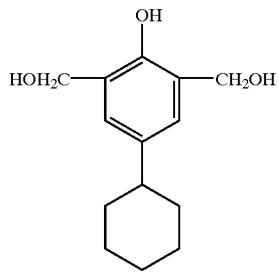
DML-PCHP
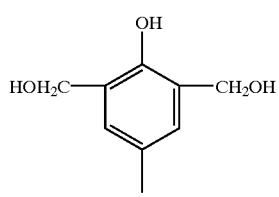
DML-PC
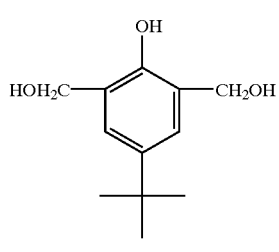
DML-PTBP
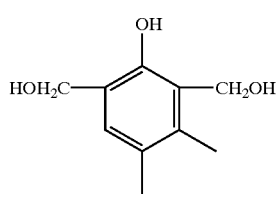
DML-34X
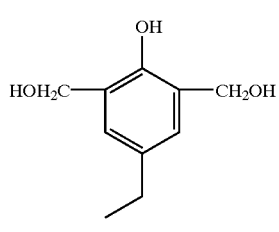
DML-EP
-continued
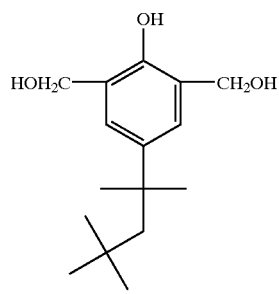
DML-POP
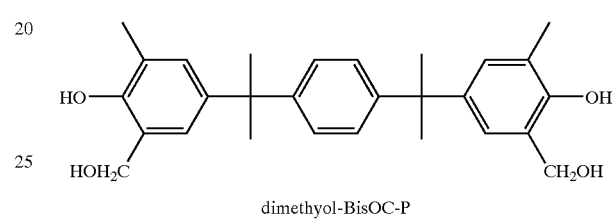
dimethyol-BisOC-P
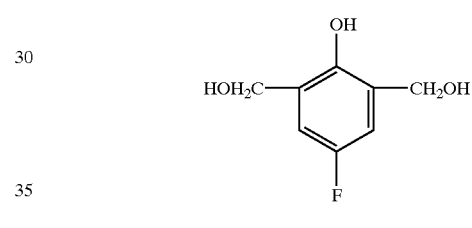
DML-PFP
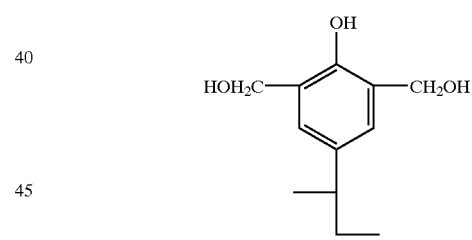
DML-PSBP
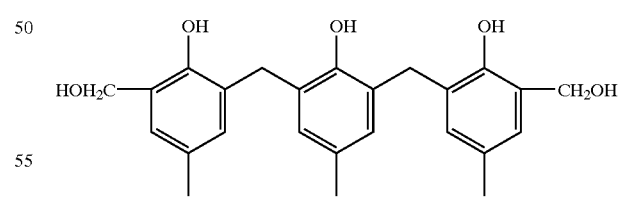
DML-MTrisPC
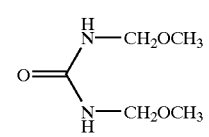
NKALAC MX-290

-continued
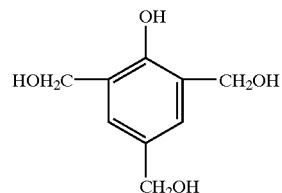
TriML-P
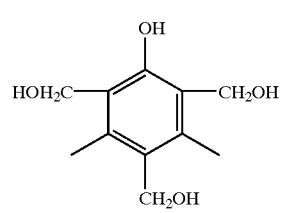
TriML-35XL
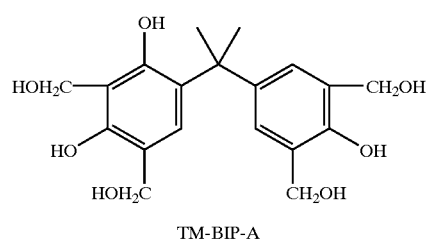
TM-BIP-A
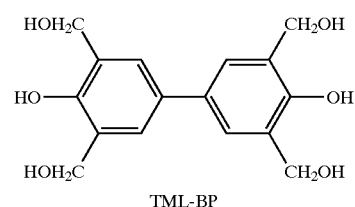
TML-BP
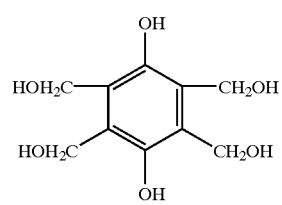
TML-HQ
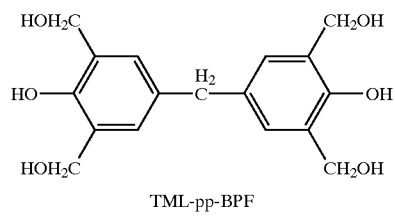
TML-pp-BPF
-continued
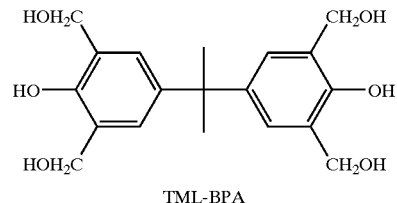
TML-BPA
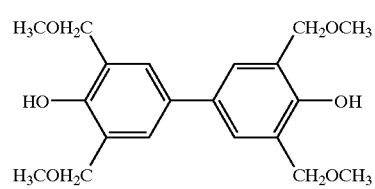
TMOM-BP
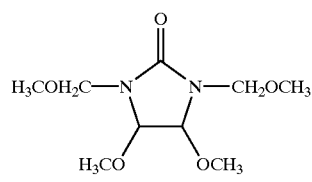
NLALAC MX-280
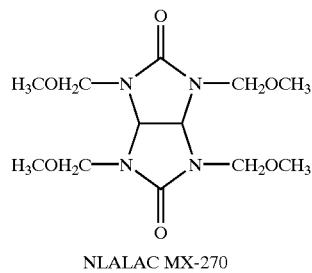
NLALAC MX-270
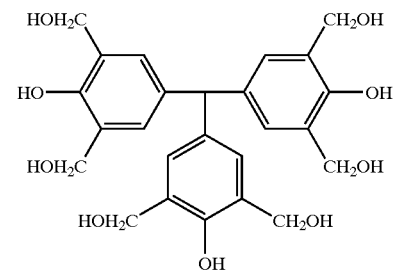
HML-TPPHBA
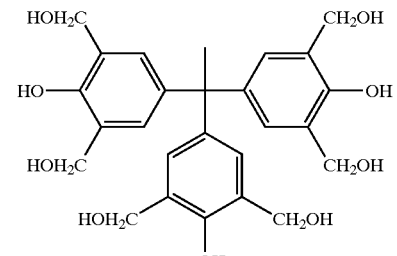
HML-TPHAP

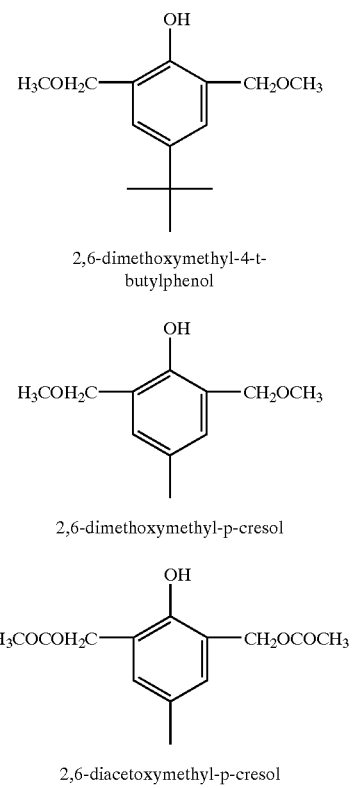

2,6-dimethoxymethyl-4-t-butylphenol 2,6-dimethoxymethyl-p-cresol 2,6-diacetoxymethyl-p-cresol The amount of additive thermally crosslinkable compound above is preferably 0.5 to 50 parts by weight, and more preferably 3 to 40 parts by weight relative to 100 parts by weight of the polymer.

In the present invention, the additive esterified quinone diazide compound (c) above is preferably a compound in which the sulfonic acid of naphthoquinone diazide is bonded to a compound containing a phenolic hydroxyl group through ester linkage. Examples such a phenolic-hydroxyl-group-containing compound are Bis-Z, BisP-EZ, TekP-4HBPA, TrisP-HAP, TrisP-PA, BisOCHP-Z, BisP-MZ, BisP-PZ, BisP-IPZ, BisOCP-IPZ, BisP-CP, BisRS-2P, BisRS-3P, BisP-OCHP, methylenetris-FR-CR, BisRS-26X, DML-MBPC, DML-MBOC, DML-OCHP, DML-PCHP, DML-PC, DML-PTBT, DML-34X, DML-EP, DML-POP, dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, HML-TPHAP (trade names, manufactured by Honshu Chemical Industry Co., Ltd.), BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP, TM-BIP-A (trade names, manufactured by Asahi Organic Chemicals Industry Co., Ltd.), 2,6-dimethoxymethyl-4-t-butylphenol, 2,6-dimethoxymethyl-p-cresol, 2,6-diacetoxymethyl-p-cresol, naphthol, tetrahydroxybenzophenone, gallic acid methyl ester, bisphenol A, methylenebisphenol, and BisP-AP (trade names, manufactured by Honshu Chemical Industry Co., Ltd.). To these substances, 4-naphthoquinone diazide sulfonic acid or 5-naphthoquinone diazide sulfonic acid is preferably introduced by ester linking. Compounds other than those described above may alternatively be used.

When the molecular weight of the naphthoquinone diazide compound exceeds 1000 in the present invention, the naphthoquinone diazide compound cannot be sufficiently pyrolized during the subsequent heat treatment. As a result, the heat resistance, the mechanical characteristics, and the adhesion of the resulting film may be degraded. In view of the above, the preferable range of the molecular weight of the naphthoquinone diazide compound is 1000 or less, and more preferably, 800 or less. The lower limit of the preferable molecular weight is 300, and more preferably, 350. The amount of naphthoquinone diazide compound is preferably 1 to 50 parts by weight relative to 100 parts by weight of the polymer.

In the present invention, although both a 4-naphthoquinone diazide sulfonylester compound and a 5-naphthoquinone diazide sulfonylester compound can be suitably used, the selection is preferably made among a 4-naphthoquinone diazide sulfonylester compound and a 5-naphthoquinone diazide sulfonylester compound according to the wavelength of the exposure. A naphthoquinone diazide sulfonylester compound containing both the 4-naphthoquinone diazide sulfonylester compound and 5-naphthoquinone diazide sulfonylester compound in one molecule may be employed. Moreover, a mixture of the 4-naphthoquinone diazidesulfonylester compound and the 5-naphthoquinone diazidesulfonylester compound may be used.

The naphthoquinone diazide compound of the present invention can be synthesized by an esterification reaction between a compound containing a phenolic hydroxyl group and a quinone diazide sulfonic acid compound and can be synthesized by a known process.

The resolution, sensitivity, the ratio of the remaining film can be improved with the use of the naphthoquinone diazide.

If necessary, a compound including a phenolic hydroxyl group may be added so as to improve the sensitivity of the photosensitive heat-resistant precursor composition.

Examples of the compound including a phenolic hydroxyl group are Bis-Z, BisOC-Z, BisOPP-Z, BisP-CP, Bis26X-Z, Bis-OTBP-Z, BisOCHP-Z, BisOCR-CP, BisP-MZ, BisP-EZ, Bis26X-CP, BisP-PZ, BisP-IPZ, BisCR-IPC, BisOCP-IPZ, BisOIPP-CP, Bis26X-IPZ, BisOTBP-CP, TekP-4HBPA (tetrakisP-DO-BPA), TrisP-HAP, TrisP-PA, BisOFP-Z, BisRS-2P, BisPG-26X, BisRS-3P, BisOC-OCHP, BisPC-OCHP, Bis25X-OCHP, Bis26X-OCHP, BisOCHP-OC, Bis236T-OCHP, methylenetris-FR-CR, BisRS-26X, BisRS-OCHP (trade names, manufactured by Honshu Chemical Industry Co., Ltd.), BIR-OC, BIP-PC, BIR-PC, BIR-PTBP, BIR-PCHP, BIP-BIOC-F, 4PC, BIR-BIPC-F, and TEP-BIP-A (trade names, manufactured by Asahi Organic Chemicals Industry Co., Ltd.) Among these, examples of the compound containing a phenolic hydroxyl group particularly preferred in the present invention are Bis-Z, BisP-EZ, TekP-4HBPA, TrisP-HAP, TrisP-PA, BisOCHP-Z, BisP-MZ, BisP-PZ, BisP-IPZ, BisOCP-IPZ, BisP-CP, BisRS-2P, BisRS-3P, BisP-OCHP, methylenetris-FR-CR, BisRS-26X, BIP-PC, BIR-PC, BIR-PTBP, and BIR-BIPC-F. Among these examples of the compound having a phenolic hydroxyl group, Bis-Z, TekP-4HBPA, TrisP-HAP, TrisP-PA, BisRS-2P, BisRS-3P, BIR-PC, BIR-PTBP, and BIR-BIPC-F are yet more preferred. When the phenolic-hydroxyl-group-containing compound is added, the resulting resin composition hardly dissolves in an alkaline developing solution before exposure but readily dissolves in the alkaline developing solution after exposure. Thus, film thinning due to development can be prevented, and the development can be completed in a short time.

The amount of additive compound containing a phenolic hydroxyl group is preferably 1 to 50 parts by weight, and more preferably 3 to 40 parts by weight relative to 100 parts by weight of the polymer. If necessary, the following may be blended to improve the wettability of the substrate to the photosensitive heat-resistant precursor composition: a surfactant; esters such as ethyl lactate or propylene glycol monomethyl ether acetate; alcohols such as ethanol; ketones such as cyclohexanone and methyl isobutyl ketone; and ethers such as tetrahydrofuran or dioxane. Moreover, inorganic particles, such as silicon dioxide and titanium dioxide, or a polyimide powder may be added.

In order to enhance the adhesion to a base substrate such as a silicon wafer, 0.5 to 10 percent by weight of a silane coupling agent, a titanium chelating agent, or the like may added to the varnish of the photosensitive heat-resistant resin precursor composition, or the base substrate may be subjected to preliminary treatment using such a chemical solution.

When these substances are added to the varnish, a silane coupling agent, such as methyl methacryloxy dimethoxysilane or 3-aminopropyltrimethoxysilane, a titanium chelating agent, or an aluminum chelating agent is added in an amount of 0.5 to 10 percent by weight relative to the polymer in the varnish.

In treating the substrate, 0.5 to 20 percent by weight of the coupling agent described above is dissolved in a solvent such as isopropanol, ethanol, methanol, water, tetrahydrofuran, propylene glycol monomethyl ether acetate, propylene glycol monomethyl ether, ethyl lactate, or diethyl adipate to obtain a solution, and the surface of the substrate is treated with the resulting solution by means of spin-coating, dipping, spraying, steaming or the like. In some cases, heating at a temperature of 50° C. to 300° C. may be subsequently performed to accelerate the reaction between the substrate and the coupling agent.

However, the above-described photosensitive heat-resistant precursor composition must not contain onium salts, diallyl compounds, tetraalkylammonium salts, or the like, which inhibit dissolution of the component (a) in an alkaline aqueous solution. If these substances are contained, decomposition of the compound occurs during the subsequent heat treatment, thereby generating acid or base. As a result, the film becomes deteriorated, and the heat resistance, mechanical properties, and adhesion of the resulting film may be degraded.

Next, a method for forming a heat-resistant resin pattern with the photosensitive heat-resistant precursor composition of the present invention is explained.

The photosensitive heat-resistant precursor composition is applied on a substrate. As the substrate, a silicon wafer, ceramics, gallium arsenide, or the like is used, but the substrate is not limited to these. Examples of the method of application are spinning using a spinner, spraying, and roll coating. The thickness of the applied coat depends on the method of application, the solid content of the composition, and the viscosity. of the composition; however, the thickness is generally 0.1 to 150 μm after drying.

Next, the substrate coated with the photosensitive heat-resistant precursor composition is dried to obtain a photosensitive heat-resistant precursor composition film. Drying is preferably performed at a temperature of 50 to 150 degrees for 1 minute to several hours using an oven, a hot plate, infrared light, or the like.

Next, actinic radiation treatment is performed on the photosensitive heat-resistant precursor composition film through a mask including a desired pattern so as to expose the film. Examples of the actinic rays used in the exposure are ultraviolet light, visible rays, electron beams, and X-rays. Preferably, an i-line (365 nm), an h-line (405 nm), or a g-line (436 nm) of a mercury lamp is used in the present invention.

A heat-resistant resin pattern is formed by removing the exposed portion with a developing solution. The developing solution is preferably an aqueous solution of an alkaline compound such as aqueous tetramethylammonium, diethanolamine, diethylaminoethanol, sodium hydrate, potassium hydrate, sodium carbonate, potassium carbonate, triethylamine, diethylamine, methylamine, dimethylamine, dimethylaminoethyl acetate, dimethylaminoethanol, dimethylaminoethylmethacrylate, cyclohexylamine, ethyldiamine, or hexamethylenediamine. If necessary, a polar solvent such as N-methyl-2-pyrrolidone, N,N-dimethylformamide, N,N-dimethylacetoamide, dimethylsulfoxide, γ-butyrolactone, or dimethylacrylamide; alcohols such as methanol, ethanol, or isopropanol; esters such as ethyl lactate or propylene glycol monomethyl ether acetate; ketones such as cyclopentanone, cyclohexanone, isobutylketone, or methylisobutylketone may be added, either alone or in combination, to the alkaline aqueous solution. Rinsing with water is performed after the development. During rinsing, alcohols, such as ethanol or isopropylalcohol, or esters such as ethyl lactate or propylene glycol monomethyl ether acetate may be added to the water.

After the development, heating at 200 to 500 degrees is performed to form a heat-resistant resin film. During this heat treatment, the temperature is either increased in incremental steps according to selected temperatures, or is continuously increased within a particular temperature range. The heat treatment is performed for 5 minutes to 5 hours. Examples of the heat treatment are heating in incremental steps at 130 degrees, 200 degrees, and 350 degrees, for 30 minutes at each temperature; and continuously and linearly increasing the temperature from room temperature to 400 degrees in 2 hours.

The heat-resistant resin film formed from the photosensitive heat-resistant precursor composition is used as a passivation film of a semiconductor, a protection film of a semiconductor element, an interlayer insulating film between layers of high-density-mount multilayer interconnections, or the like.

The composition of the present invention is employed to form an insulating layer of a display device. The display device comprises a first electrode formed on a substrate, and a second electrode opposing the first electrode. Specific examples of the display device are liquid crystal displays (LCDs), electrochromic diplays (ECDs), electroluminescent displays (ELDs), and display devices using organic electroluminescent elements (organic electroluminescent devices). An organic electroluminescent device is a display device including an organic electroluminescent element. The electroluminescent element comprises a first electrode formed on a substrate; a thin-film layer formed on the first electrode, the thin-film layer comprising a luminescent layer comprising an organic compound; and a second electrode formed on the thin-film layer.

EXAMPLES

The present invention will now be described by way of examples and technologies. These examples do not limit the scope of the present invention. The evaluation of the examples of the photosensitive heat-resistant resin precursor composition is conducted by the methods described below.
Preparation of Photosensitive Polyimide Precursor Film A photosensitive heat-resistant resin precursor composition, hereinafter referred to as the "varnish", was applied on a 6-inch silicon wafer. The thickness thereof was adjusted to ensure a thickness of 7 μm after pre-baking. Subsequently, the varnish was pre-baked for 3 minutes at 120° C. using a hot plate (Mark-7, manufactured by Tokyo Electron Ltd.) so as to obtain a photosensitive polyimide precursor film.

Method for Measuring the Thickness

The thickness was measured at a refractive index of 1.64 using Lambda Ace STM-602, manufactured by Dainippon Screen MFG. Co., Ltd.

Exposure

A reticle having an incised pattern was set in an exposing machine (i-line stepper DSW-8000, manufactured by GCA Co.), and i-line exposure was performed for various exposure time periods at an intensity of 365 nm.

Development

A 2.38% tetramethylammonium hydroxide aqueous solution was sprayed for 10 seconds at 50 rotations using a developing machine of Mark-7 manufactured by Tokyo Electron Ltd. After being left to stand for 60 seconds at 0 rotation, the wafer was rinsed with water at 400 rotations and was dried by spinning for 10 seconds at 3000 rotations.

Calculation of the Ratio of the Remaining Film

The ratio of the remaining film was calculated according to the formula below:

Ratio of the remaining film (%)=the thickness after development/the thickness after pre-baking×100

Calculation of the Sensitivity

After the exposure and the development, the exposure time required to form a 50 μm line-and-space pattern (1L/1S) having a width 1:1, hereinafter referred to as the "optimum exposure time", was calculated.

Calculation of the Resolution

After the exposure and the development, the minimum pattern size at the optimum exposure time required to form a 50 μm line-and-space pattern (1L/1S) having a width 1:1 was defined as the resolution.

Calculation of the Shrinkage Rate

The prepared photosensitive polyimide precursor film was heated in a nitrogen gas stream (oxygen concentration: 20 ppm or less) at 140° C. for 30 minutes using an inert oven INH-21CD manufactured by Koyo Lindberg Co. Subsequently, the temperature was increased up to 350° C. over one hour and the precursor film was heated at 350° C. for one hour to prepare a cured film. The shrinkage rate was calculated based on the formula below:

Shrinkage rate (%)=(the thickness after pre-baking−the thickness after curing)/the thickness after pre-baking×100.

Synthetic Example 1

Synthesis of Hydroxyl-Group-Containing Acid Anhydride (a)

In a dry nitrogen gas stream, 18.3 g (0.05 mol) of 2,2-bis(3-amino-4-hydroxyphenyl)hexafluoropropane (BAHF) and 34.2 g (0.3 mol) of arylglycidyl ether were dissolved in 100 g of gamma butyrolactone (GBL), and the resulting solution was cooled to −15° C. Subsequently, 22.1 g (0.11 mol) of trimellitoyl chloride anhydride dissolved in 50 g of GBL was dropped into this solution so that the temperature of the reaction liquid did not exceed 0° C. After dropping, the reaction was performed for 4 hours at 0° C. The resulting solution was concentrated using a rotary evaporator, and the concentrated solution was added to 1 l of toluene to obtain the acid anhydride (a).

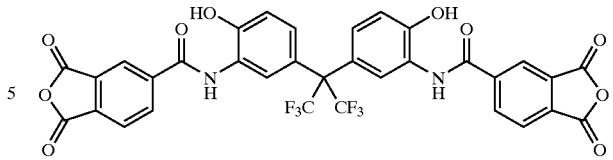

Synthetic Example 2

Synthesis of Hydroxyl-Group-Containing Diamine Compound (b)

A solution of 18.3 g (0.05 mol) of BAHF dissolved in 100 ml of acetone and 17.4 g (0.3 mol) of propylene oxide was cooled to −15° C. Into this solution, a solution prepared by dissolving 20.4 g (0.11 mol) of 4-nitrobenzoyl chloride in 100 ml of acetone was dropped. After dropping, the resulting mixture was allowed to react for 4 hours at −15° C. and was allowed to return to room temperature. White solid deposits were separated by filtering and were dried in vacuo at 50° C.

Thirty grams of the solid was placed in a 300 ml stainless-steel autoclave, was dispersed into 250 ml of methyl cellosolve, and was blended with 2 g of 5% palladium-carbon. Hydrogen was introduced thereto by a balloon, and a reduction reaction was performed at room temperature. After approximately 2 hours and after confirming that no further deflation of the balloon was possible, the reaction was terminated. Subsequently, the palladium compound, i.e., the catalyst, was removed by filtering. Condensation was then performed with a rotary evaporator so as to obtain the diamine compound (b). The obtained solid was directly used in the reaction.

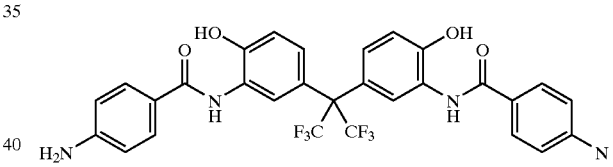

Synthetic Example 3

Synthesis of Hydroxyl-Group-Containing Diamine Compound (c)

Into 50 ml of acetone and 30 g (0.34 mol) of propylene oxide, 15.4 g (0.1 mol) of 2-amino-4-nitrophenol was dissolved, and the resulting solution was cooled to −15° C. Into the solution, a solution prepared by dissolving 11.2 g (0.055 mol) of isophthalic chloride in 60 ml of acetone was slowly dropped. After dropping, the mixture was allowed to react for 4 hours at −15° C. Subsequently, the reacted solution was allowed to return to room temperature, and the deposits were separated by filtering.

The deposits were dissolved in 200 ml of GBL, 3 g of 5% palladium-carbon was added to the resulting solution, and the mixture was thoroughly stirred. A balloon containing hydrogen gas was attached to this mixture, and the stirring was continued at room temperature until the balloon containing hydrogen gas did not deflate anymore, and subsequently the stirring was further continued for 2 hours with the deflated balloon still attached. Upon completion of stirring, the palladium compound was removed by filtering, and the resulting solution was condensed to half the volume by a rotary evaporator. Ethanol was added thereto to allow recrystallization so as to obtain crystals of the target compound.

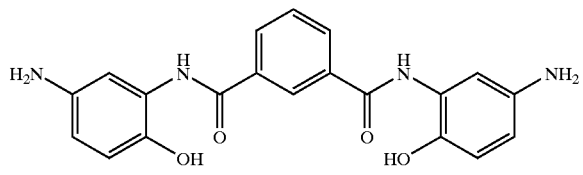

Synthetic Example 4

Synthesis of Hydroxyl-Group-Containing Diamine Compound (d)

Into 100 ml of acetone and 17.4 g (0.3 mol) of propylene oxide, 15.4 g (0.1 mol) of 2-amino-4-nitrophenol was dissolved, and the resulting solution was cooled to −15° C. To this solution, a solution prepared by dissolving 20.4 (0.11 mol) of 4-nitrobenzoyl chloride in 100 ml of acetone was slowly dropped. After dropping, they were allowed to react for 4 hours at −15° C. The reacted solution was allowed to return to room temperature, and the deposits were separated by filtering. Subsequently, crystals of the target compound were obtained as in SYNTHETIC EXAMPLE 2.

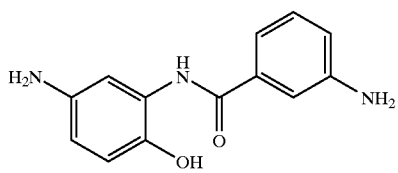

Synthetic Example 5

Synthesis of Quinone Diazide Compound (1)

In a dry nitrogen gas stream, 16.10 g (0.05 mol) of BisRS-2P (trade name, manufactured by Honshu Chemical Industry Co., Ltd.) and 26.86 g (0.1 mol) of 5-naphthoquinone diazide sulfonyl chloride were dissolved in 450 g of 1,4-dioxane at room temperature. To the resulting solution, a mixture of 50 g of 1,4-dioxane and 10.12 g of triethylamine was dropped so that the temperature of the system did not exceed 35° C. The resulting solution after dropping was stirred for 2 hours at 30° C. Triethylamine salt was filtered, and the filtrate was added to water. Subsequently, the deposits were separated by filtering and were dried in a vacuum drier to obtain the quinone diazide compound (1).

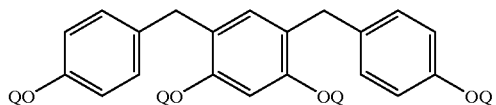

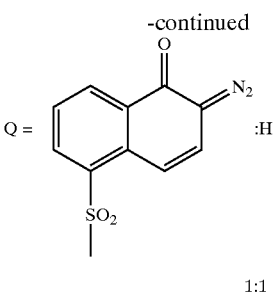

1:1

Synthetic Example 6

Synthesis of Quinone Diazide Compound (2)

In a dry nitrogen gas stream, 5.31 g (0.05 mol) of TrisP-HAP (trade name, manufactured by Honshu Chemical Industry Co., Ltd.) and 40.28 g (0.15 mol) of 5-naphthoquinone diazide sulfonyl chloride were dissolved in 450 g of 1,4-dioxane at room temperature. The quinone diazide compound (2) was prepared as in SYNTHETIC EXAMPLE 5 but with a mixture of 50 g of 1,4-dioxane and 15.18 g of triethylamine.

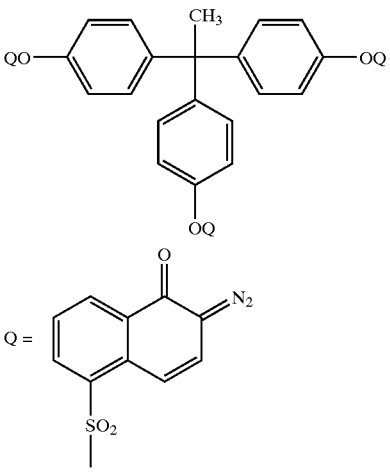

Synthetic Example 7

Synthesis of Quinone Diazide Compound (3)

In a dry nitrogen gas stream, 19.72 g (0.05 mol) of BIR-PTBP (trade name, manufactured by Asahi Organic Chemicals Industry Co., Ltd.) and 26.86 g (0.1 mol) of 4-naphthoquinone diazide sulfonyl chloride were dissolved in 450 g of 1,4-dioxane at room temperature. The quinone diazide compound (3) was prepared as in SYNTHETIC EXAMPLE 5 but with a mixture of 50 g of 1,4-dioxane and 10.12 g of triethylamine.

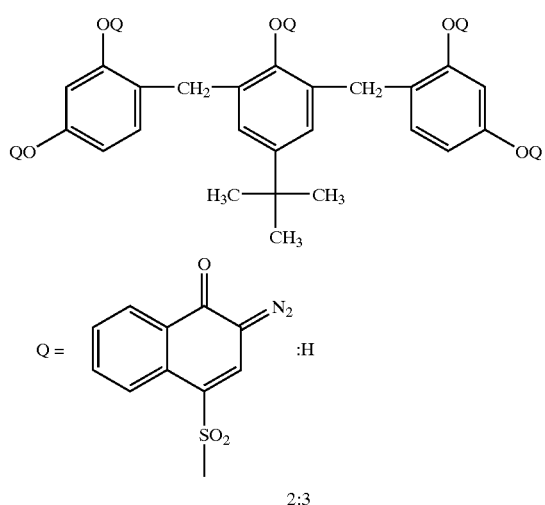

2:3

Synthetic Example 8

Synthesis of Quinone Diazide Compound (4)

In a dry nitrogen gas stream, 11.41 g (0.05 mol) of bisphenol A and 26.86 g (0.1 mol) of 5-naphthoquinone diazide sulfonyl chloride were dissolved in 450 g of 1,4-dioxane at room temperature. The quinone diazide compound (4) was prepared as in SYNTHETIC EXAMPLE 5 but with a mixture of 50 g of 1,4-dioxane and 10.12 g of triethylamine.

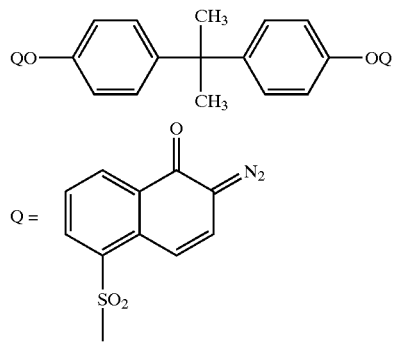

Synthetic Example 9

Synthesis of a Diethyl Ester Dichloride Solution (a) of 2,2-bis(3,4-dicarboxyphenyl)hexafluoropropane dianhydride In a dry nitrogen gas stream, 35.54 g (0.08 mol) of 2,2-bis(3,4-dicarboxyphenyl)hexafluoropropane dianhydride was allowed to react with 36.9 g (0.8 mol) of ethyl alcohol by stirring at 95° C. for 6 hours. Excess ethanol was removed by distillation under a low pressure so as to obtain pyromellitic acid diethyl ester. Subsequently, 95.17 g (0.8 mol) of thionyl chloride and 70 g of tetrahydrofuran (THF) were added thereto and were allowed to react at 40° C. for 3 hours. Next, 331 g of N-methylpyrrolidone was added thereto, and excess thionyl chloride and THF were removed under a low pressure so as to obtain 376.86 g (0.08 mol) of the pyromellitic acid diethyl ester chloride solution (b).

Synthetic Example 10

Synthesis of 3,3',4,4'-benzophenone tetracarboxylic diethyl ester dichloride solution (b)

In a dry nitrogen gas stream, 25.78 g (0.08 mol) of 3,3',4,4'-benzophenone tetracarboxylic dianhydride was allowed to react with 36.90 g (0.8 mol) of ethanol by stirring at 95° C. for 6 hours. Excess ethanol was removed in a reduced pressure by distillation so as to obtain 3,3',4,4'-benzophenone tetracarboxylic diethyl ester. Subsequently, 95.17 g (0.8 mol) of thionyl chloride and 70 g of tetrahydrofuran (THF) were added thereto and were allowed to react at 40° C. for 3 hours. Then, 200 g of N-methylpyrrolidone was added thereto, and excess thionyl chloride and THF were removed under a low pressure to obtain 233.15 g (0.08 mol) of 3,3',4,4'-benzophenone tetracarboxylic acid diethyl ester dichloride solution (b).

The compounds having phenolic hydroxyl groups employed in the EXAMPLES and COMPARATIVE EXAMPLES below were as follows:

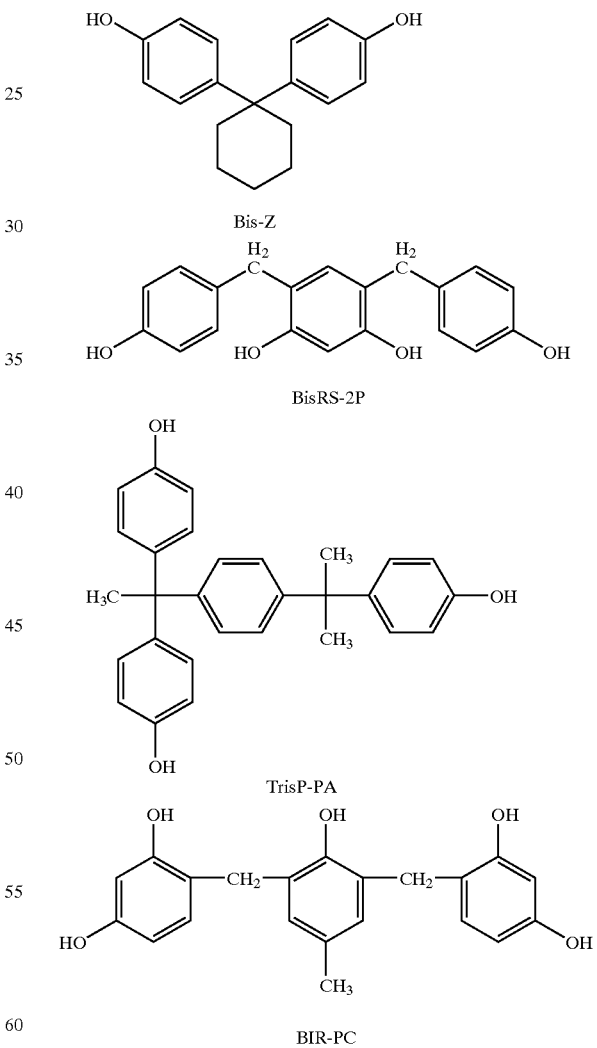

Example 1

In a dry nitrogen gas stream, 5.01 g (0.02 mol) of 4,4'-diaminodiphenyl ether and 1.24 g (0.005 mol) of 1,3-bis(3-aminopropyl)tetramethyldisiloxane were dissolved in 50 g of N-methyl-2-pyrrolidone (NMP). Into the resulting solution, 21.4 g (0.03 mol) of the hydroxyl-group-containing acid anhydride (a) obtained in SYNTHETIC EXAMPLE 1 and 14 g of NMP were added, and they were allowed to react for one hour at 20° C., and then 4 hours at 50° C. Subsequently, a solution obtained by diluting 7.14 g (0.06 mol) of N,N-dimethylformamide dimethylacetal with 5 g of NMP was dropped over 10 minutes. After dropping, the mixture was stirred for 3 hours at 50° C.

To 40 g of the resulting solution, 2 g of the quinone diazide compound (1) prepared in SYNTHETIC EXAMPLE 5 and 1.2 g of thermally crosslinkable compound Nikalac MX-270 (trade name, manufactured by Sanwa Chemical Co., Ltd.) were added to obtain a varnish A which is a photosensitive polyimide precursor composition. A photosensitive polyimide precursor film was formed on a silicon wafer using this varnish according to the process described above. After the film was exposed and developed, The sensitivity of the varnish, the ratio of the remaining film, the resolution, and the shrinkage rate were evaluated.

Example 2

In a dry nitrogen gas stream, 15.1 g (0.025 mol) of the hydroxyl-group-containing diamine (b) was dissolved in 50 g of N-methyl-2-pyrrolidone (NMP). To the resulting solution, 17.5 g (0.025 mol) of the hydroxyl-group-containing acid anhydride (a) obtained in SYNTHETIC EXAMPLE 1 and 30 g of pyridine were added and were allowed to react at 60° C. for 6 hours. Upon completion of the reaction, the resulting solution was fed into 2 l of water, and the deposits of the polymer solids were retrieved by filtering. The polymer solids were dried at 80° C. by a vacuum drier for 20 hours.

Into 30 g of GBL, 10 g of the polymer solids, 2 g of the quinone diazide compound (2) obtained in SYNTHETIC EXAMPLE 6, 2 g of a thermally crosslinkable compound DML-MBPC (trade name, manufactured by Honshu Chemical Industry Co., Ltd.), 1.5 g of Bis-Z (trade name, manufactured by Honshu Chemical Industry Co., Ltd.), and 1 g of vinyltrimethoxysilane were dissolved to obtain a varnish B which is a photosensitive polyimide precursor composition. Using the resulting varnish, a photosensitive polyimide precursor film was formed on a silicon wafer, was exposed, and was developed. The sensitivity of the varnish, the ratio of the remaining film, the resolution, and the shrinkage rate were evaluated.

Example 3

In a dry nitrogen gas stream, 17 g (0.045 mol) of the hydroxyl-group-containing diamine compound (c) obtained in SYNTHETIC EXAMPLE 3 and 1.24 g (0.005 mol) of 1,3-bis(3-aminopropyl)tetramethyldisiloxane were dissolved in 50 g of NMP. To the resulting solution, 12.4 g (0.04 mol) of 3,3',4,4'-diphenyl ether tetracarboxylic acid anhydride and 21 g of NMP were added and were allowed to react for 1 hour at 20° C., and then for 2 hours at 50° C. To this mixture, 0.98 g (0.01 mol) of maleic acid anhydride was added, and the mixture was stirred for 2 hours at 50° C. Subsequently, a solution obtained by diluting 14.7 g (0.1 mol) of N,N-dimethylformamide diethylacetal with 5 g of NMP was dropped over 10 minutes. After dropping, the mixture was stirred for 3 hours at 50° C.

Into 30 g of the resulting solution, 1.6 g of the quinone diazide compound (3) obtained in SYNTHETIC EXAMPLE 7 and 1 g of a thermally crosslinkable compound TML-HQ (trade name, manufactured by Honshu Chemical Industry Co., Ltd.) were dissolved so as to prepare a varnish C which is a photosensitive polyimide precursor composition. Using this varnish, a photosensitive polyimide precursor film was formed on a silicon wafer as described above, was exposed, and was developed. The sensitivity of the varnish, the ratio of the remaining film, the resolution, and the shrinkage rate were evaluated.

Example 4

In a dry nitrogen gas stream, 6.08 g (0.025 mol) of the hydroxyl-group-containing diamine compound (d), 4.51 g (0.0225 mol) of 4,4'-diaminediphenyl ether, 0.62 g (0.0025 mol) of 1,3-bis(3-aminopropyl)tetramethyldisiloxane were dissolved in 70 g of NMP. To the resulting solution, 24.99 g (0.035 mol) of a hydroxyl-group-containing acid anhydride, 4.41 g (0.015 mol) of 3,3',4,4'-biphenyltetracarboxylic acid dianhydride, and 25 g of NMP were added. The resulting mixture was stirred for 1 hour at room temperature and then for 2 hours at 50° C. Subsequently, a solution prepared by diluting 17.6 g (0.2 mol) of glycidyl methyl ether with 10 g of NMP was added, and the mixture was stirred for 6 hours at 70° C.

Into 40 g of the resulting polymer solution, 2.5 g of the quinone diazide compound (4) obtained in SYNTHETIC EXAMPLE 8 and 1.5 g of a thermally crosslinkable compound HML-TPHAP (trade name, manufactured by Honshu Chemical Industry Co., Ltd.) were dissolved to prepare a varnish D which is a photosensitive polyimide precursor composition. Using this varnish, a photosensitive polyimide precursor film was formed on a silicon wafer as described above, was exposed, and was developed. The sensitivity of the varnish, the ratio of the remaining film, the resolution, and the shrinkage rate were evaluated.

Example 5

Into 50 g of the polymer solution obtained in EXAMPLE 3, 2.5 g of quinone diazide compound (1) employed in EXAMPLE 1, 2 g of a thermally crosslinkable compound dimethylol-BisOC-P (trade name, manufactured by Honshu Chemical Industry Co., Ltd.), and 2 g of BisRS-2P (trade name, manufactured by Honshu Chemical Industry Co., Ltd.) were dissolved so as to obtain a varnish E which is a photosensitive polyimide precursor composition. Using this varnish, a photosensitive polyimide precursor film was formed on a silicon wafer as described above, was exposed, and was developed. The sensitivity of the varnish, the ratio of the remaining film, the resolution, and the shrinkage rate were evaluated.

Example 6

Into 40 g of the polymer solution obtained in EXAMPLE 1, 2 g of the quinone diazide compound (2) employed in EXAMPLE 2, 2.5 g of a thermally crosslinkable compound DML-POP (trade name, manufactured by Honshu Chemical Industry Co., Ltd.), and 2.5 g of TrisP-PA (trade name, manufactured by Honshu Chemical Industry Co., Ltd.) were dissolved to prepare a varnish F which is a photosensitive polyimide precursor composition. Using this varnish, a photosensitive polyimide precursor film was formed on a silicon wafer as described above, was exposed, and was developed. The sensitivity of the varnish, the ratio of the remaining film, the resolution, and the shrinkage rate were evaluated.

Example 7

Into 40 g of the polymer solution obtained in EXAMPLE 4, 2 g of the quinone diazide compound (2) employed in EXAMPLE 2, 2 g of thermally crosslinkable compound DML-MTrisPC (trade name, manufactured by Honshu Chemical Industry Co., Ltd.), and 2.5 g of BIR-PC (trade name, manufactured by Asahi organic Chemicals Industry Co., Ltd.) were dissolved to prepare a varnish G which is a photosensitive polyimide precursor composition. Using this varnish, a photosensitive polyimide precursor film was formed on a silicon wafer as described above, was exposed, and was developed. The sensitivity of the varnish, the ratio of the remaining film, the resolution, and the shrinkage rate were evaluated.

Example 8

Into 40 g of the polymer solution obtained in EXAMPLE 4, 2 g of the quinone diazide compound (2) employed in EXAMPLE 2, 1.5 g of a thermally crosslinkable compound, i.e., 2,6-diacetoxymethyl-p-cresol, and 1.5 g of BIR-PC (trade name, manufactured by Asahi Organic Chemicals Industry Co., Ltd.) were dissolved to prepare a varnish H which is a photosensitive polyimide precursor composition. Using this varnish, a photosensitive polyimide precursor film was formed on a silicon wafer as described above, was exposed, and was developed. The sensitivity of the varnish, the ratio of the remaining film, the resolution, and the shrinkage rate were evaluated.

Example 9

Into 30 g of solution obtained in EXAMPLE 3, 1.6 g of the quinone diazide compound (3) obtained in SYNTHETIC EXAMPLE 7 and 2 g of thermally crosslinkable compound ML-26X (trade name, manufactured by Honshu Chemical Industry Co., Ltd.) were dissolved to prepare a varnish I which is a photosensitive polyimide precursor composition. Using this varnish, a photosensitive polyimide precursor film was formed on a silicon wafer as described above, was exposed, and was developed. The sensitivity of the varnish, the ratio of the remaining film, the resolution, and the shrinkage rate were evaluated.

Example 10

In a dry nitrogen gas stream, 10.89 g (0.054 mol) of 4,4'-diaminodiphenyl ether, 1.86 g (0.007 mol) of 1,3-bis(3-aminopropyl)tetramethyldisiloxane, and 2.05 g (0.019 mol) of 3-aminophenol (manufactured by Tokyo Kasei Kogyo Co., Ltd.) functioning as end sealants were dissolved in 20 g of N-methyl-2-pyrrolidone (NMP). To the resulting solution, 23.27 g (0.075 mol) of bis(3,4-dicarboxyphenyl) ether dianhydride and 15 g of NMP were added, and the mixture was allowed to react for 1 hour at 20° C. and then for 4 hours at 50° C. Subsequently, a solution prepared by diluting 15.19 g (0.127 mol) of N,N-dimethylformamide dimethylacetal with 4 g of NMP was dropped therein over 10 minutes. After dropping, the mixture was stirred for 3 hours at 50° C. Subsequently, 46.0 g of NMP was added to prepare a polymer solution.

To the resulting polymer solution, 7 g of the above-described naphthoquinone diazide compound (1), 3.5 g of Nikalac MX-270 (trade name, manufactured by Sanwa Chemical Co., Ltd.), and 4 g of Bis-Z (trade name, manufactured by Honshu Chemical Industry Co., Ltd.) functioning as end sealants were added to obtain a varnish J which is a photosensitive polyimide precursor composition. Using this varnish, a photosensitive polyimide precursor film was formed on a silicon wafer as described above, was exposed, and was developed. The sensitivity of the varnish, the ratio of the remaining film, and the resolution were evaluated.

Example 11

In a dry nitrogen gas stream, 10.14 g (0.051 mol) of 3,4'-diaminodiphenyl ether, 1.86 g (0.075 mol) of 1,3-bis(3-aminopropyl)tetramethyldisiloxane, 4.26 g (0.034 mol) of 4-aminothiophenol (manufactured by Tokyo Kasei Kogyo Co., Ltd.) functioning as end sealants, and 11.93 g (0.151 mol) of pyridine were dissolved in 50 g of N-methyl-2-pyrrolidone (NMP). Into the resulting solution, 358.03 (0.076 mol) of the diethyl ester dichloride solution (a) of 2,2-bis(3,4-dicarboxyphenyl)hexafluoropropane dianhydride was dropped so that the system temperature does not exceed 10° C. After the dropping, the mixture was stirred at room temperature for 6 hours. Upon completion of the reaction, the solution was fed into 2 l of water, and the deposits of the polymer solids were recovered by filtering. The polymer solids were dried in a vacuum drier at 80° C. for 20 hours.

Into 23 g of gamma butyrolactone, 10 g of the polymer solids, 2.9 g of the above-described naphthoquinone diazide compound (2), 0.8 g of Nikalac MX-280 (trade name, manufactured by Sanwa Chemical Co., Ltd.), 1.3 g of BisRS-2P (trade name, manufactured by Honshu Chemical Industry Co., Ltd.) as the phenolic-hydroxyl-group-containing compound, and 0.3 g of vinyltrimethoxysilane were dissolved so as to prepare a varnish K which is a photosensitive polyimide precursor composition. Using this varnish, a photosensitive polyimide precursor film was formed on a silicon wafer as described above, was exposed, and was developed. The sensitivity of the varnish, the ratio of the remaining film, and the resolution were evaluated.

Example 12

In a dry nitrogen gas stream, 3.97 g (0.016 mol) of 4,4'-diaminodiphenyl sulfone, 1.39 g (0.0056 mol) of 1,3-bis(3-aminopropyl)tetramethyldisiloxane, and 6.16 g (0.078 mol) of pyridine were dissolved in 50 g of N-methyl-2-pyrrolidone (NMP), and were allowed to react for 2 hours in room temperature. Into the resulting solution, 113.66 g (0.039 mol) of the 3,3'4,4'-benzophenontetracarboxylic diethyl ester dichloride solution (b) was dropped so that the system temperature does not exceed 10° C. After dropping, the mixture was stirred at room temperature for 4 hours. Subsequently, 2.72 g (0.0278 mol) of maleic anhydride was added as end sealants, and the mixture was allowed to react by stirring for 3 hours at 50° C. Upon completion of the reaction, the resulting solution was fed into 2 l of water, and the polymer solids were recovered by filtering. The polymer solids were dried at 80° C. in a vacuum drier for 20 hours.

Into 22 g of NMP, 10 g of the resulting polymer solids, 2 g of the naphthoquinone diazide compound (3), 0.42 g of TMOM-BP (trade name, manufactured by Honshu Chemical Industry Co., Ltd.) as the thermally crosslinkable compound, and 1.0 g of TrisP-PA (trade name, manufactured by Honshu Chemical Industry Co., Ltd.) were dissolved to obtain a varnish L which is a photosensitive polyimide precursor composition. Using this varnish, a photosensitive polyimide precursor film was formed on a silicon wafer as described above, was exposed, and was developed. The sensitivity of the varnish, the ratio of the remaining film, and the resolution were evaluated.

Example 13

In a dry nitrogen gas stream, 2.13 g (0.0035 mol) of the hydroxyl-group-containing diamine compound (b) prepared in SYNTHETIC EXAMPLE 2, 10.18 g (0.0505 mol) of 4,4'-diaminodiphenyl ether, 1.86 g (0.007 mol) of 1,3-bis(3-aminopropyl)tetramethyldisiloxane, and 2.05 g (0.019 mol) of 3-aminophenol (manufactured by Tokyo Kasei Kogyo Co., Ltd.) functioning as end sealants were dissolved in 50 g of N-methyl-2-pyrrolidone (NMP). To the resulting solution, 23.27 g (0.0705 mol) of bis(3,4-dicarboxyphenyl) ether dianhydride and 30 g of NMP were added, and the mixture was allowed to react for 1 hour at 20° C. and then for 4 hours at 50° C. Subsequently, a solution prepared by diluting 15.19 g (0.127 mol) of N,N-dimethylformamide dimethylacetal with 10 g of NMP was dropped therein over 10 minutes. After dropping, the mixture was stirred for 3 hours at 50° C. Upon completion of the reaction, the solution was fed into 2 l of water, and the deposits of the polymer solids were recovered. The polymer solids were dried at 80° C. in a vacuum drier for 20 hours.

Into 30 g of GBL, 10 g of the polymer solids, 2 g of the above-described naphthoquinone diazide compound (1), 2.0 g of Nikalac MX-270 (trade name, manufactured by Sanwa Chemical Co., Ltd.) as the thermally crosslinkable compound, 1.5 g of BIR-PC (trade name, manufactured by Asahi Organic Chemicals Industry Co., Ltd.) as the compound having phenolic hydroxyl groups, and 0.3 g of vinyltrimethoxysilane were dissolved so as to prepare a varnish M which is a photosensitive polyimide precursor composition. Using this varnish, a photosensitive polyimide precursor film was formed on a silicon wafer, was exposed, and was developed. The sensitivity of the varnish, the ratio of the remaining film, and the resolution were evaluated.

Example 14

Into 50 g of N-methyl-2-pyrrolidone (NMP), 29,58 g (0.0486 mol) of the hydroxyl-group-containing diamine compound (b) prepared in SYNTHETIC EXAMPLE 2, 1.09 g (0.0054 mol) of 3,4'-diaminodiphenyl ether, 1.86 g (0.007 mol) of 1,3-bis(3-aminopropyl)tetramethyldisiloxane, and 2.05 g (0.019 mol) of 3-aminophenol (manufactured by Tokyo Kasei Kogyo Co., Ltd.) functioning as end sealants were dissolved. To the resulting solution, 23.27 g (0.0705 mol) of bis(3,4-dicarboxyphenyl)ether dianhydride and 30 g of NMP were added, and the mixture was allowed to react for 1 hour at 20° C. and then for 4 hours at 50° C. Subsequently, a solution prepared by diluting 15.19 g (0.127 mol) of N,N-dimethylformamide dimethylacetal with 10 g of NMP was dropped therein over 10 minutes. After dropping, the mixture was stirred for 3 hours at 50° C. Upon completion of the reaction, the solution was fed into 2 l of water, and the deposits of the polymer solids were recovered by filtering. The polymer solids were dried at 80° C. in a vacuum drier for 20 hours.

Into 30 g of GBL, 10 g of the polymer solids, 2 g of the above-described naphthoquinone diazide compound (1), 2.0 g of 2,6-dimethoxymethyl-4-t-butylphenol (trade name, manufactured by Honshu Chemical Industry Co., Ltd.), 1.5 g of TrisP-PA (trade name, manufactured by Honshu Chemical Industry Co., Ltd.) as the phenolic-hydroxyl-group-containing compound, and 0.3 g of vinyltrimethoxysilane were dissolved so as to prepare a varnish N which is a photosensitive polyimide precursor composition. Using this varnish, a photosensitive polyimide precursor film was formed on a silicon wafer as described above, was exposed, and was developed. The sensitivity of the varnish, the ratio of the remaining film, and the resolution were evaluated.

Example 15

Into 30 g of gamma butyrolactone, 5 g of the polymer solids obtained in EXAMPLE 2, 5 g of the polymer solids obtained in EXAMPLE 11, 2.9 g of the naphthoquinone diazide compound (2), 2.0 g of a thermally crosslinkable compound, i.e., 2,6-diacetoxymethyl-p-cresol, 3.5 g of 4PC (trade name, manufactured by Asahi Organic Chemicals Industry Co., Ltd.) as the compound having phenolic hydroxyl groups, and 0.3 g of vinyltrimethoxysilane were dissolved to prepare a varnish P which is a photosensitive polyimide precursor composition. Using this varnish, a photosensitive polyimide precursor film was formed on a silicon wafer as described above, was exposed, and was developed. The sensitivity of the varnish, the ratio of the remaining film, and the resolution were evaluated.

Example 16

In a dry nitrogen gas stream, 18.3 g (0.05 mol) of 2,2-bis(3-amino-4-hydroxyphenyl)hexafluoropropane was dissolved in 50 g of N-methyl-2-pyrrolidone (NMP) and 26.4 g (0.3 mol) of glycidyl methyl ether, and the resulting solution was cooled to −15° C. Into the resulting solution, a solution prepared by dissolving 7.38 g (0.025 mol) of diphenyl ether dicarboxylic dichloride and 5.08 g (0.025 mol) of isophthalic dichloride into 25 g of GBL was dropped so that the inside temperature does not exceed 0° C. Upon completion of dropping, the mixture was stirred for 6 hours at −15° C.

Upon completion of the reaction, the solution was fed into 3 l of water and white deposits were recovered. The deposits were collected by filtering, were washed three times with water, and were dried at 80° C. in a vacuum drier for 20 hours.

Into 30 g of NMP, 10 g of the resulting polymer power, 2.0 g of quinone diazide compound (2), and 1 g of thermally crosslinkable compound TM-BIP-A (trade name, manufactured by Asahi Organic Chemicals Industry Co., Ltd.) were dissolved so as to prepare a varnish Q which is a photosensitive polybenzoxazole precursor composition. Using this varnish, a photosensitive polybenzoxazole precursor film was formed on a silicon wafer as described above, was exposed, and was developed. The sensitivity of the varnish, the ratio of the remaining film, the resolution, and the shrinkage rate were evaluated.

Example 17

In a dry nitrogen gas stream, 15.1 g (0.025 mol) of hydroxyl-group-containing diamine (b) prepared in SYNTHETIC EXAMPLE 2 was dissolved in 50 g of N-methyl-2-pyrrolidone (NMP). To the resulting solution, 17.5 g (0.025 mol) of hydroxy-group-containing acid anhydride (a) prepared in SYNTHETIC EXAMPLE 1 and 30 g of pyridine were added, and the mixture was allowed to react for 6 hours at 60° C. Upon completion of the reaction, the solution was fed into 2 l of water, and the deposits of the polymer solids were recovered by filtering. The polymer solids were dried at 80° C. in a vacuum drier for 20 hours.

10 g of the polymer solids, 2 g of the quinone diazide compound (2) prepared in SYNTHETIC EXAMPLE 6, 2 g of thermally crosslinkable compound Nikalac MX-280 (trade name, manufactured by Sanwa Chemical Co., Ltd.), 1.5 g of Bis-Z (trade name, manufactured by Honshu Chemical Industry Co., Ltd.), and 1 g of vinyltrimethoxysilane were dissolved in 30 g of GBL so as to prepare a varnish R which is a photosensitive polyimide precursor composition. Using this varnish, a photosensitive polyimide precursor film was formed on a silicon wafer as described above, was exposed, and was developed. The sensitivity of the varnish, the ratio of the remaining film, the resolution, and the shrinkage rate were evaluated.

Example 18

An indium tin oxide (ITO) transparent electrode film having a thickness of 130 nm was formed on the surface of no-alkali glass having a thickness of 1.1 mm by means of sputtering vapor deposition so as to prepare a glass substrate. The glass substrate was cut into 120×100 mm. A photoresist was applied on the ITO substrate, and was exposed and developed by a common photolithographic method for patterning. The unnecessary portions of the ITO were removed by etching, and then the photoresist was removed to form a striped pattern on the ITO film. The resulting striped first electrode had a pitch of 100 μm.

The density of the varnish A prepared in EXAMPLE 1 was adjusted with NMP. The adjusted varnish A was applied on the first electrodes on the substrate by means of spin-coating and was pre-baked for 3 minutes at 120° C. on a hot plate. The resulting film was exposed to UV light through a photomask, and only the exposed portion was dissolved and developed in a 2.38% TMAH aqueous solution. The resulting film was rinsed with deionized water to obtain a polyimide precursor pattern. The polyimide precursor pattern was cured by heating in a clean oven in a nitrogen atmosphere at 170° C. for 30 minutes, and then at 320° C. for 60 minutes so as form a insulating layer covering edges of the first electrodes. The thickness of the insulating layer was approximately 1 μm.

An organic electroluminescent device was made using the substrate provided with the insulating layer. A thin-film layer comprising a luminescent layer was vacuum-deposited by a resistance-wire heating method. A hole transport layer was formed on the entire effective area of the substrate by vapor deposition. A luminescent layer and aluminum second electrode was developed through a shadow mask.

The above-described processed substrate was discharged from the deposition device. The substrate was bonded to a sealing glass plate by a curable epoxy resin so as to seal the substrate. Thus, a simple-matrix color organic electroluminescent device having a striped first electrode composed of ITO, a patterned luminescent layer formed on the first electrode, and a striped second electrode orthogonal to the first electrode was fabricated. When this display device was driven line-sequentially, superior display characteristics were obtained. At the border areas of the insulating layer, neither the thin-film layer nor the second electrode suffered from thinning or stepped cuts, and they were deposited without trouble. As a result, the brightness within the luminescent region was even, and stable light emission was achieved. Moreover, the cross-section had a forward tapered shape.

Example 19

A simple-matrix color organic electroluminescent device was fabricated using the varnish B prepared in EXAMPLE 2 according to the method described in EXAMPLE 18 but with curing conditions of 230° C. for 30 minutes. When the resulting device was driven line-sequentially, no degradation in the brightness was observed, and superior display characteristics were obtained.

Example 20

A simple-matrix color organic electroluminescent device was fabricated using the varnish E prepared in EXAMPLE 5 according to the method described in EXAMPLE 18 but with curing conditions of 230° C. for 30 minutes. When the resulting device was driven line-sequentially, no degradation in the brightness was observed, and superior display characteristics were obtained.

Example 21

A simple-matrix color organic electroluminescent device was fabricated using the varnish H prepared in EXAMPLE 8 according to the method described in EXAMPLE 18 but with curing conditions of 250° C. for 30 minutes. When the resulting device was driven line-sequentially, no degradation in the brightness was observed, and superior display characteristics were obtained.

A simple-matrix color organic electroluminescent device was fabricated using the varnish R prepared in EXAMPLE 17 according to the method described in EXAMPLE 18 but with curing conditions of 230° C. for 30 minutes. When the resulting device was driven line-sequentially, no degradation in the brightness was observed, and superior display characteristics were obtained.

Example 23

A simple-matrix color organic electroluminescent device was fabricated using the varnish J prepared in EXAMPLE 10 according to the method described in EXAMPLE 18 but with curing conditions of 250° C. for 30 minutes. When the resulting device was driven line-sequentially, no degradation in the brightness was observed, and superior display characteristics were obtained.

Example 24

A simple-matrix color organic electroluminescent device was fabricated using the varnish M prepared in EXAMPLE 13 according to the method described in EXAMPLE 18 but with curing conditions of 230° C. for 60 minutes. When the resulting device was driven line-sequentially, no degradation in the brightness was observed, and superior display characteristics were obtained.

Example 25

A photosensitive polyimide insulating layer was formed on the first electrode on the substrate according to the method in EXAMPLE 18 except that curing conditions were 230° C. for 30 minutes in oven air and the thickness of the insulating layer was 3 μm. That the volume resistivity was $5 \times 10^{10}$ Ωcm was confirmed. The cross-section of the border area of the insulating layer had a forward tapered shape. The cone angle was approximately 45°. The infrared absorption spectrum of the insulating layer was measured in reflection geometry. The absorption peaks of the imide structure of polyimide were detected at around 1780 $cm^{-1}$ and 1377 $cm^{-1}$.

An organic electroluminescent device was fabricated using the substrate provided with the insulating layer. The glass substrate provided with the insulating layer is subjected an oxygen plasma process or UV irradiation. Subsequently, a hole injection material or a hole transportation material dissolved in alcohol was applied on to the substrate by spin coating. The resulting substrate was heated at 200° C. for 30 minutes in an oven.

A pattern is formed at openings using red, blue and green organic luminescent materials, which are dissolved in toluene, by an inkjet method. The substrate was heated at 80° C. for 30 minutes in an oven.

Lastly, a second electrode was formed as in EXAMPLE 18 and sealing was performed.

The resulting simple-matrix color organic electroluminescent device included the striped first electrode composed of ITO comprising 816 strips at a pitch of 100 μm each having a width of 80 μm; patterned green, red, and blue luminescent layers arranged on the first electrode, and the second electrode comprising 200 strips at a pitch of 300 μm each having a width of 250 and is orthogonal to the first electrode. Since three luminescent regions in red, green, and blue constituted one pixel, the electroluminescent device of the present invention had 272×200 pixels at a pitch of 300 μm. Since only the portions of the first electrode exposed by the insulating layer emitted light, one luminescent region had a shape of a rectangle having a width of 70 μm and a length of 250 μm.

When this device was driven line-sequentially, superior display characteristics were obtained. Because the edge portions of the first electrode are covered with the isolating layer, no short-circuiting due to the field concentration was observed. Moreover, because the cross-section had the front tapered shape, neither the thin-film layer nor the second electrode suffered from thinning and stepped cuts at the border portions, and they were smoothly deposited. Thus, no degradation in the brightness was observed inside the luminescent region, and stable light emission was achieved. As the durability test, the device was held at 85° C. for 250 hours, and the electroluminescent characteristics were evaluated. The luminescent region did not diminish compared to the initial period, and superior electroluminescence was obtained.

Example 26

An ITO electrode (pixels) of a predetermined pattern was formed on a planarizing film of a substrate, i.e., a TFT substrate, comprising switching elements so that the ITO electrode was in contact with the source/drain electrodes.

Using this substrate, an insulating layer, a hole injection or transport material, an electroluminescent material, and a second electrode were formed on the substrate, and the resulting substrate was sealed as in EXAMPLE 25.

When this device was driven in an active matrix mode, superior display characteristics were obtained. Because the edge portions of the first electrode are covered with the isolating layer, no short-circuiting due to the field concentration was observed. Moreover, because the cross-section had the front tapered shape, neither the thin-film layer nor the second electrode suffered from thinning and stepped cuts at the border portions, and they were smoothly deposited. Thus, no degradation in the brightness was observed inside the luminescent region, and stable light emission was achieved. As the durability test, the device was held at 85° C. for 250 hours, and the electroluminescent characteristics were evaluated. The luminescent region did not diminish compared to the initial period, and superior electroluminescence was obtained.

Comparative Example 1

Into 40 g of the polyimide precursor solution synthesized as in EXAMPLE 1, 2.0 g of the quinone diazide compound (1) prepared in EXAMPLE 1 was dissolved so as to prepare a varnish A1 which is a photosensitive polyimide precursor composition. Using this varnish, a photosensitive polyimide precursor film was formed on a silicon wafer as described above, was exposed, and was developed. The sensitivity of the varnish, the ratio of the remaining film, the resolution, and the shrinkage rate were evaluated.

Comparative Example 2

Into 40 g of the polyimide precursor solution synthesized as in EXAMPLE 1, 2 g of the quinone diazide compound (1) prepared in EXAMPLE 1 and 1 g of TrisP-PA (trade name, manufactured by Honshu Chemical Industry Co., Ltd.) were dissolved so as to prepare a varnish A2 which is a photosensitive polyimide precursor composition. Using this varnish, a photosensitive polyimide precursor film was formed on a silicon wafer as described above, was exposed, and was developed. The sensitivity of the varnish, the ratio of the remaining film, the resolution, and the shrinkage rate were evaluated.

Comparative Example 3

Into 30 g of the polyimide precursor solution synthesized as in EXAMPLE 3, 1.6 g of quinone diazide compound (3) prepared in EXAMPLE 3 and 0.8 g of BisP-AP (trade name, manufactured by Honshu Chemical Industry Co., Ltd.) were dissolved so as to prepare a varnish A3 which is a photosensitive polyimide precursor composition. Using this varnish, a photosensitive polyimide precursor film was formed on a silicon wafer as described above, was exposed, and was developed. The sensitivity of the varnish, the ratio of the remaining film, the resolution, and the shrinkage rate were evaluated.

Comparative Example 4

Into 40 g of the polymer solution prepared in EXAMPLE 4, 2 g of the quinone diazide compound (2) prepared in EXAMPLE 2, 1.0 g of a thermally crosslinkable compound outside the scope of the present invention, and 1.0 g of BIR-PC (trade name, manufactured by Asahi Organic Chemicals Industry Co., Ltd.) were dissolved so as to prepare a varnish A4 which is a photosensitive polyimide precursor composition. Using this varnish, a photosensitive polyimide precursor film was formed on a silicon wafer as described above, was exposed, and was developed. The sensitivity of the varnish, the ratio of the remaining film, the resolution, and the shrinkage rate were evaluated.

Comparative Example 5

A varnish A5, i.e., the photosensitive polyimide precursor composition, was prepared as in EXAMPLE 10 but without the thermally crosslinkable compound of EXAMPLE 10. Using this varnish, a photosensitive polyimide precursor film was formed on a silicon wafer as described above, was exposed, and was developed. The sensitivity of the varnish, the ratio of the remaining film, and the resolution were evaluated.

Comparative Example 6

A varnish A6, i.e., the photosensitive polyimide precursor composition, was prepared as in EXAMPLE 13 but without the thermally crosslinkable compound of EXAMPLE 13. Using this varnish, a photosensitive polyimide precursor film was formed on a silicon wafer as described above, was exposed, and was developed. The sensitivity of the varnish, the ratio of the remaining film, and the resolution were evaluated.

Comparative Example 7

A varnish A7, i.e., the photosensitive polyimide precursor composition, was prepared as in EXAMPLE 15 but without the thermally crosslinkable compound of EXAMPLE 15. Using this varnish, a photosensitive polyimide precursor film was formed on a silicon wafer as described above, was exposed, and was developed. The sensitivity of the varnish, the ratio of the remaining film, and the resolution were evaluated.

Comparative Example 8

A simple-matrix color organic electroluminescent device was made as in EXAMPLE 18 but with the varnish A1 prepared in COMPARATIVE EXAMPLE 1 and the curing conditions of 300° C. for 60 minutes. When this display device was driven line-sequentially, no degradation in brightness was observed. However, degradation in luminescence was observed at the edge portions of the electroluminescent display region, and the display characteristics were poor.

Comparative Example 9

A simple-matrix color organic electroluminescent device was made as in EXAMPLE 18 but with the varnish A2 prepared in COMPARATIVE EXAMPLE 2 and the curing conditions of 230° C. for 30 minutes. When this display device was driven line-sequentially, no degradation in brightness was observed. However, degradation in luminescence was observed at the edge portions of the electroluminescent display region, and the display characteristics were poor.

Comparative Example 10

A simple-matrix color organic electroluminescent device was made as in EXAMPLE 18 but with the varnish A4 prepared in COMPARATIVE EXAMPLE 4 and the curing conditions of 250° C. for 30 minutes. When this display device was driven line-sequentially, no degradation in brightness was observed. However, degradation in luminescence was observed at the edge portions of the electroluminescent display region, and the display characteristics were poor.

Comparative Example 11

A simple-matrix color organic electroluminescent device was made as in EXAMPLE 18 but with the varnish A5 prepared in COMPARATIVE EXAMPLE 5 and the curing conditions of 250° C. for 30 minutes. When this display device was driven line-sequentially, no degradation in brightness was observed. However, degradation in luminescence was observed at the edge portions of the electroluminescent display region, and the display characteristics were poor.

Comparative Example 12

A simple-matrix color organic electroluminescent device was made as in EXAMPLE 18 but with the varnish A6 prepared in COMPARATIVE EXAMPLE 6 and the curing conditions of 230° C. for 30 minutes. When this display device was driven line-sequentially, no degradation in brightness was observed. However, degradation in luminescence was observed at the edge portions of the electroluminescent display region, and the display characteristics were poor.

Comparative Example 13

A simple-matrix color organic electroluminescent device was made as in EXAMPLE 18 but with the varnish A7 prepared in COMPARATIVE EXAMPLE 7 and the curing conditions of 230° C. for 30 minutes. When this display device was driven line-sequentially, no degradation in brightness was observed. However, degradation in luminescence was observed at the edge portions of the electroluminescent display region, and the display characteristics were poor.

Comparative Example 14

A simple matrix color organic electroluminescent device was fabricated as in EXAMPLE 18 except that a varnish A8 prepared by dissolving 2.0 g of the quinone diazide compound (1) used in EXAMPLE 1 and 0.5 g of an onium salt, DPI-TF (trade name, manufactured by Toyo Gosei Co., Ltd.), into 40 g of the polyimide precursor solution synthesized as in EXAMPLE 1 was used and that the curing condition was set at 250° C. for 30 minutes. When this display device was driven line-sequentially, degradation in brightness was observed, degradation in electroluminescence was significant at the edge portions of the electroluminescent display region, and the display characteristics were poor.

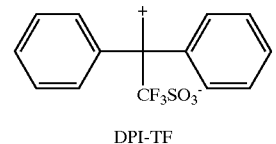

DPI-TF

The evaluation results of EXAMPLES 1 to 17 and COMPARATIVE EXAMPLES 1 to 7 are shown in Table 1 below.

TABLE 1

|  | Thermally crosslinkable compound | End sealant | Phenolic low-molecular compound | Varnish | Sensitivity (msec) | Ratio of the remaining film (%) | Resolution ($\mu$m) | Shrinkage rate (%) |
|---|---|---|---|---|---|---|---|---|
| Example 1 | Nikalac MX-270 | None | None | A | 900 | 90 | 10 | 27 |
| Example 2 | DML-MBPC | None | Bis-Z | B | 950 | 90 | 10 | 25 |
| Example 3 | TML-HQ | None | None | C | 850 | 89 | 10 | 24 |
| Example 4 | HML-TPHAP | None | None | D | 1000 | 90 | 10 | 23 |
| Example 5 | dimethylol-BisOC-P | None | BisRS-2P | E | 950 | 89 | 10 | 28 |
| Example 6 | DML-POP | None | TrisP-PA | F | 950 | 91 | 10 | 28 |
| Example 7 | DML-MtrisPC | None | BIR-PC | G | 1000 | 90 | 10 | 28 |
| Example 8 | 2,6-diacetoxymethyl-p-cresol | None | BIR-PC | H | 1000 | 87 | 10 | 23 |
| Example 9 | ML-26X | None | None | I | 950 | 87 | 10 | 33 |
| Example 10 | Nikalac MX-270 | 3-aminophenol | Bis-Z | J | 950 | 90 | 10 | 24 |
| Example 11 | Nikalac MX-280 | 4-aminothiophenol | Bis-Z | K | 850 | 89 | 10 | 25 |

TABLE 1-continued

| | Thermally crosslinkable compound | End sealant | Phenolic low-molecular compound | Varnish | Sensitivity (msec) | Ratio of the remaining film (%) | Resolution (μm) | Shrinkage rate (%) |
|---|---|---|---|---|---|---|---|---|
| Example 12 | TMON-BP | maleic anhydride | TrisP-PA | L | 850 | 89 | 10 | 23 |
| Example 13 | Nikalac MX-270 | 3-aminophenol | BIR-PC | M | 800 | 90 | 10 | 24 |
| Example 14 | 2,6-dimethoxymethyl-4-t-butylphenol | 3-aminophenol | TrisP-PA | N | 650 | 88 | 10 | 25 |
| Example 15 | 2,6-diacetoxymethyl-p-cresol | 4-aminothiophenol | 4PC | P | 750 | 88 | 10 | 23 |
| Example 16 | TM-BIP-A | None | None | Q | 1050 | 87 | 10 | 25 |
| Example 17 | Nikalac MX-280 | None | Bis-Z | R | 750 | 87 | 10 | 25 |
| Comparative Example 1 | None | None | None | A1 | 1800 | 85 | 30 | 38 |
| Comparative Example 2 | None | None | TrisP-PA | A2 | 1600 | 85 | 20 | 40 |
| Comparative Example 3 | None | None | BisP-PA | A3 | 1550 | 84 | 20 | 40 |
| Comparative Example 4 | melamine | None | BIR-PC | A4 | 1500 | 84 | 20 | 33 |
| Comparative Example 5 | None | 3-aminophenol | Bis-Z | A5 | 1400 | 84 | 20 | 40 |
| Comparative Example 6 | None | 3-aminophenol | BIR-PC | A6 | 1400 | 84 | 20 | 40 |
| Comparative Example 7 | None | 4-aminothiophenol | 4PC | A7 | 1400 | 84 | 20 | 40 |

INDUSTRIAL APPLICABILITY

According to the present invention, a positive photosensitive resin precursor composition that can be developed with an alkaline aqueous solution and exhibits superior resolution and sensitivity. A decrease in the thickness of the unexposed portion of the film is small (ratio of the remaining film) and the shrinkage rate after curing is low. The composition is particularly suitable for use in a protective film of a semiconductor element, an interlayer insulating film, and an insulating layer of a display.

What is claimed is:

1. A positive photosensitive resin precursor composition comprising (a), one of (b1) and (b2), and (c):
   (a) a polyamic acid ester and/or a polyamic acid polymer, both of which are soluble in an alkaline aqueous solution;
   (b1) a phenolic-hydroxyl-group-containing thermally crosslinkable compound comprising an organic-group-$R^1$-substituted methylol group represented by formula (1) (wherein $R^1$ is not a hydrogen atom),

(b2) a thermally crosslinkable compound containing a ureal organic group substituted by an organic group $R^1$ and represented by formula (2)

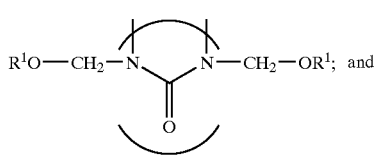

and
   (c) an esterified quinone diazide compound.

2. The positive photosensitive resin precursor composition of claim 1, wherein $R^1$ is an alkyl group having a carbon number of 1 to 20 or an $R^2CO$ group, $R^2$ being an alkyl group having a carbon number of 1 to 20.

3. The positive photosensitive resin precursor composition of claim 1, wherein the polymer of component (a) comprises a structural unit represented by formula (3) as a main component:

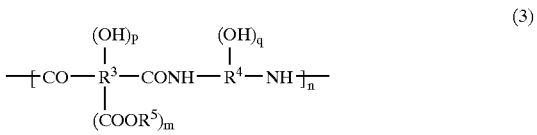

(wherein $R^3$ is a bivalent to octavalent organic group containing at least two carbon atoms, $R^4$ is a bivalent to hexavalent organic group containing at least two carbon atoms, $R^5$ is hydrogen or an organic group having a carbon number of 1 to 20, n is an integer between 10 and 100000, m is an integer between 0 and 2, p and q are integers between 0 and 4, and p+q>0).

4. The positive photosensitive resin precursor composition of claim 3, wherein $R^3(COOR^5)_m(OH)_p$ in formula (3) is represented by formula (4):

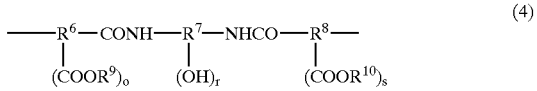

(wherein $R^6$ and $R^8$ each represent a bivalent to tetravalent organic group having a carbon number of 2 to 20, $R^7$ represents a trivalent to hexavalent organic group containing hydroxyl groups and having a carbon number of 3 to 20, $R^9$ and $R^{10}$ each represent a hydrogen or an organic group having a carbon number of 1 to 20, o and s each represent an integer between 0 and 2, and r represents an integer between 1 and 4).

5. The positive photosensitive resin precursor composition of claim 3, wherein $R^4(OH)_q$ in formula (3) is represented by formula (5):

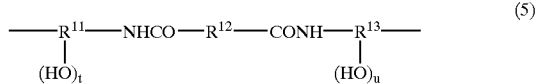

(5)

(wherein $R^{11}$ and $R^{13}$ each represent a trivalent to tetravalent organic group containing hydroxyl groups and having a carbon number of 2 to 20, $R^{12}$ represents a bivalent organic group having a carbon number of 2 to 30, and t and u each represent an integer of 1 or 2.

6. The positive photosensitive resin precursor composition of claim 3, wherein $R^4(OH)_q$ in formula (3) is represented by formula (6):

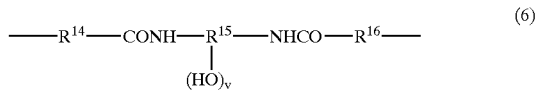

(6)

(wherein $R^{14}$ and $R^{16}$ each represent a bivalent organic group having a carbon number of 2 to 20, $R^{15}$ represents a trivalent to hexavalent organic group containing hydroxyl groups and having a carbon number of 3 to 20, and v represents an integer between 1 and 4).

7. The positive photosensitive resin precursor composition of claim 3, wherein $R^4(OH)_q$ in formula (3) is represented by formula (7):

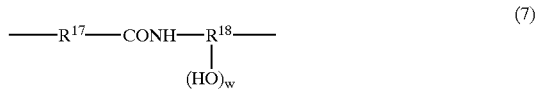

(7)

(wherein $R^{17}$ is a bivalent organic group having a carbon number of 2 to 20, $R^{18}$ is a trivalent to hexavalent organic group containing hydroxyl groups and having a carbon number of 3 to 20, and w represents an integer between 1 and 4.

8. A method for forming a relief pattern comprising:
a step of applying the positive photosensitive resin precursor composition according to claim 1 on a supporting substrate and drying the composition;
a step of exposing the composition;
a step of developing the composition with an alkaline developer; and
a step of heating the composition.

9. A semiconductor electronic component comprising a surface protection film comprising a relief pattern formed according to the method of claim 8 or an interlayer insulating film comprising a relief pattern formed according to the method of claim 8.

10. A display device for an organic electroluminescent element, the device comprising a first electrode formed on a substrate, an insulating layer formed on the first substrate and partially exposing the first electrode, and a second electrode opposing the first electrode, wherein the insulating layer comprises a relief pattern formed according to the method of claim 8.

11. The display device for an organic electroluminescent element according to claim 10, wherein the insulating layer covers the edge portions of the first electrode.

12. The display device for an organic electroluminescent element according to claim 10, wherein the cross-section of the insulating layer at the border portions exposing the first electrode has a forward tapered shape.

13. The display device for an organic electroluminescent element according to claim 10, wherein the display device comprises the organic electroluminescent element comprising a first electrode formed on a substrate, a thin-film layer including a luminescent layer comprising an organic compound, and a second electrode formed on the thin-film layer.

* * * * *